(12) United States Patent
Jang et al.

(10) Patent No.: US 12,200,999 B2
(45) Date of Patent: *Jan. 14, 2025

(54) DISPLAY PANEL AND DISPLAY DEVICE INCLUDING THE SAME

(71) Applicant: LG Display Co., Ltd., Seoul (KR)

(72) Inventors: Hyung Uk Jang, Paju-si (KR); Chul Nam, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/482,426

(22) Filed: Oct. 6, 2023

(65) Prior Publication Data

US 2024/0040879 A1 Feb. 1, 2024

Related U.S. Application Data

(63) Continuation of application No. 17/412,015, filed on Aug. 25, 2021, now Pat. No. 11,818,934.

(30) Foreign Application Priority Data

Sep. 3, 2020 (KR) ........................ 10-2020-0112527

(51) Int. Cl.
*H10K 59/121* (2023.01)
*H10K 50/80* (2023.01)
(Continued)

(52) U.S. Cl.
CPC ......... *H10K 59/353* (2023.02); *H10K 50/865* (2023.02); *H10K 50/868* (2023.02); *H10K 59/121* (2023.02); *H10K 59/65* (2023.02)

(58) Field of Classification Search
CPC .. H10K 59/353; H10K 50/865; H10K 50/868; H10K 59/121; H10K 59/65;
(Continued)

(56) References Cited

U.S. PATENT DOCUMENTS 11,818,934 B2 * 11/2023 Jang ..................... H10K 50/865
2009/0309489 A1 12/2009 Takata et al.
(Continued)

FOREIGN PATENT DOCUMENTS

| CN | 109192076 A | 1/2019 |
| WO | WO 2020/151289 A | 7/2020 |

OTHER PUBLICATIONS

United Kingdom Intellectual Property Office, Combined Search and Examination Report, United Kingdom Patent Application No. GB 2112549.7, Mar. 1, 2022, seven pages.

(Continued)

*Primary Examiner* — Donald L Raleigh
(74) *Attorney, Agent, or Firm* — Fenwick & West LLP

(57) ABSTRACT

An embodiment discloses a display panel and a display device including the same. The display panel includes a first display region in which a plurality of pixels are disposed, and a second display region including a plurality of pixel regions, in which a plurality of pixels are disposed, and a plurality of light-transmitting regions disposed between the plurality of pixel regions, wherein the second display region includes a plurality of first pixels disposed in the plurality of pixel regions, a plurality of second pixels disposed in the plurality of light-transmitting regions, and a plurality of first electrodes extending from the plurality of pixel regions to the plurality of light-transmitting regions to electrically connect the plurality of first pixels to the plurality of second pixels.

15 Claims, 28 Drawing Sheets

(51) Int. Cl.
*H10K 50/86* (2023.01)
*H10K 59/35* (2023.01)
*H10K 59/65* (2023.01)

(58) Field of Classification Search
CPC .. H10K 59/124; H10K 59/131; H10K 59/352; H10K 59/80515; H10K 59/80521; H10K 59/8792; H10K 59/88; H10K 59/126; G09G 3/3208; G09G 2300/0413; G09G 2300/0421; G09G 2300/0426; H01L 51/52
See application file for complete search history.

(56) References Cited

U.S. PATENT DOCUMENTS

| | | |
|---|---|---|
| 2013/0303776 A1 | 11/2013 | Okamoto et al. |
| 2019/0310724 A1 | 10/2019 | Yeke Yazdandoost et al. |
| 2021/0217821 A1 | 7/2021 | Han et al. |

OTHER PUBLICATIONS

United States Office Action, U.S. Appl. No. 17/412,015, filed Mar. 31, 2023, 14 pages.

* cited by examiner

DISPLAY PANEL AND DISPLAY DEVICE INCLUDING THE SAME

CROSS-REFERENCE TO RELATED APPLICATION

This application is a continuation of U.S. patent application Ser. No. 17/412,015 filed on Aug. 25, 2021, which claims priority to and the benefit of Republic of Korea Patent Application No. 10-2020-0112527, filed on Sep. 3, 2020, each of which is hereby incorporated by reference in its entirety.

BACKGROUND

1. Field of Technology

An embodiment relates to a display panel and a display device including the same.

2. Discussion of Related Art

Electroluminescence display devices are classified into inorganic light-emitting display devices and organic light-emitting display devices depending on materials of a light-emitting layer. An active-matrix-type organic light-emitting display device includes an organic light-emitting diode (OLED) that emits light by itself and has advantages in terms of a quick response time, high light emission efficiency, high luminance, and a wide viewing angle. The organic light-emitting display device has OLEDs formed in each pixel. The organic light-emitting display device may represent a black grayscale as perfect black as well as having a quick response time, high light emission efficiency, high luminance, and a wide viewing angle, and thus has an excellent contrast ratio and color gamut.

Multimedia functions of a mobile terminal have been improved. For example, a camera is basically built into a smart phone and the resolution of the camera is increasing to a level of an existing digital camera. However, a front camera of the smart phone limits the design of a screen, thereby making it difficult to design the screen. In order to reduce the space occupied by the camera, a screen design including a notch or a punch hole has been adopted in the smart phone, but it is difficult to implement a full-screen display because a screen size is still limited due to the camera.

In order to implement a full-screen display, a method of preparing an imaged region, in which pixels are disposed, in a screen of a display panel, and disposing a camera and/or various sensors at a position under the display panel which faces the imaged region has been proposed.

However, since the pixels are disposed in the imaged region, there is a problem that light transmittance is lowered, and performance of the camera and/or the various sensors is degraded. In addition, when the number of pixels in the imaged region is reduced to increase the light transmittance, a light-emitting area is reduced, and thus there is a problem in that display performance is degraded and luminance should be compensated for.

SUMMARY

An embodiment is directed to providing a display panel and a display device having an increased light-emitting area in an imaged region.

An embodiment is also directed to providing a display panel and a display device capable of securing a sufficient light-transmitting area in an imaged region.

An embodiment is also directed to providing a display panel and a display device having an improved lifespan of a pixel.

An embodiment is also directed to providing a display panel and a display device whose manufacturing costs are reduced.

It should be noted that objects of the present disclosure are not limited to the above-described object, and other objects of the present disclosure will be apparent to those skilled in the art from the following descriptions.

According to an aspect of the present disclosure, there is provided a display panel including a first display region in which a plurality of pixels are disposed, and a second display region including a plurality of pixel regions, in which a plurality of pixels are disposed, and a plurality of light-transmitting regions disposed between the plurality of pixel regions, wherein the second display region includes a plurality of first pixels disposed in the plurality of pixel regions, a plurality of second pixels disposed in the plurality of light-transmitting regions, and a plurality of first electrodes extending from the plurality of pixel regions to the plurality of light-transmitting regions to electrically connect the plurality of first pixels to the plurality of second pixels.

The second display region may include a second electrode covering the plurality of pixel regions and including a plurality of openings corresponding to the plurality of light-transmitting regions.

The second electrode may extend to an inside of each of the plurality of openings to electrically connect the plurality of first pixels to the plurality of second pixels.

The number of pixels, which are disposed in the first display region, per unit area may be the same as or different from the number of pixels, which are disposed in the second display region, per unit area.

The number of sub-pixels of each of the second pixels may be the same as or less than the number of sub-pixels of each of the first pixels.

Each of the second pixels disposed in the light-transmitting regions may include a first sub-pixel, a second sub-pixel, and a third sub-pixel.

The first sub-pixel of the second pixel may be electrically connected to a first sub-pixel of a first pixel region among the plurality of pixel regions surrounding the light-transmitting region, and the second sub-pixel of the second pixel may be electrically connected to a second sub-pixel of the first pixel region.

The first sub-pixel of the second pixel may be electrically connected to a first sub-pixel of a first pixel region among the plurality of pixel regions surrounding the light-transmitting region, and the second sub-pixel of the second pixel may be electrically connected to a second sub-pixel of a second pixel region among the plurality of pixel regions surrounding the light-transmitting region.

Each of the second pixels disposed in the light-transmitting regions may include a first unit sub-pixel and a second unit sub-pixel that emit the same color, the first unit sub-pixel may be electrically connected to a second sub-pixel of a first pixel region among the plurality of pixel regions surrounding the light-transmitting region, and the second unit sub-pixel may be electrically connected to a second sub-pixel of a second pixel region among the plurality of pixel regions surrounding the light-transmitting region.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION

Figure 1:
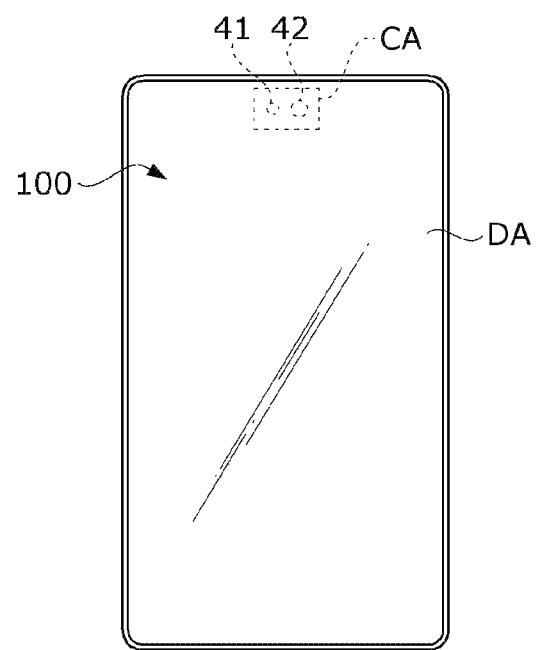
FIG. 1 is a conceptual diagram of a display device according to one embodiment of the present disclosure.

Advantages and features of the present disclosure and implementation methods thereof will be clarified through the following embodiments described with reference to the accompanying drawings. However, the present disclosure is not limited to the embodiments described below and may be embodied with a variety of different modifications. The embodiments are merely provided to allow those skilled in the art to completely understand the scope of the present disclosure, and the present disclosure is defined only by the scope of the claims.

The figures, dimensions, ratios, angles, numbers, and the like disclosed in the drawings for describing the embodiments of the present disclosure are merely illustrative and are not limited to matters shown in the present disclosure. Throughout the disclosure, like reference numerals refer to like elements. Further, in describing the present disclosure, detailed descriptions of well-known technologies will be omitted when it is determined that they may unnecessarily obscure the gist of the present disclosure.

Terms such as "including," "having," and "composed of" used herein are intended to allow other elements to be added unless the terms are used with the term "only." Any references to the singular may include the plural unless expressly stated otherwise.

Components are interpreted to include an ordinary error range even if not expressly stated.

For description of a positional relationship, for example, when the positional relationship between two parts is described as "on," "above," "below," and "next to," etc., one or more parts may be interposed therebetween unless the term "immediately" or "directly" is used in the expression.

In the description of embodiments, the terms "first," "second," and the like may be used herein to describe various elements, the elements are not limited by the terms. These terms are used only to distinguish one component from another. Therefore, a first component discussed below could be termed a second component without departing from the teachings of the present disclosure.

Throughout the disclosure, like reference numerals refer to like elements.

The features of various embodiments may be partially or entirely bonded to or combined with each other. The embodiments may be interoperated and performed in technically various ways and may be carried out independently of or in association with each other.

Hereinafter, various embodiments of the present disclosure will be described in detail with reference to the accompanying drawings.

Figure 2A:
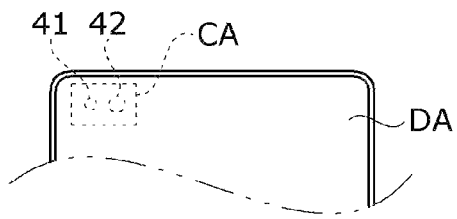
FIGS. 2A to 2D are views illustrating various arrangement positions and shapes of a second display region according to one embodiment.
Figure 2B:
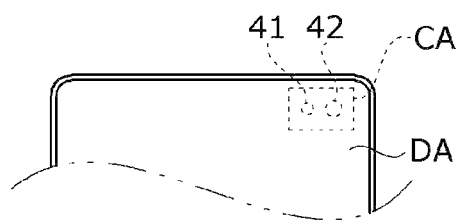
Figure 2C:
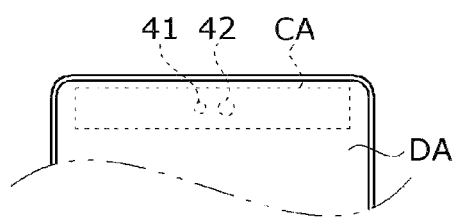
Figure 2D:
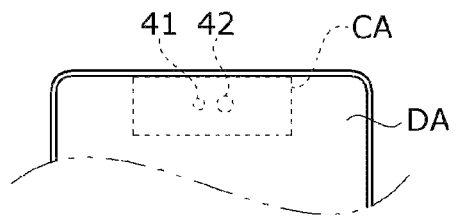
Figure 3:
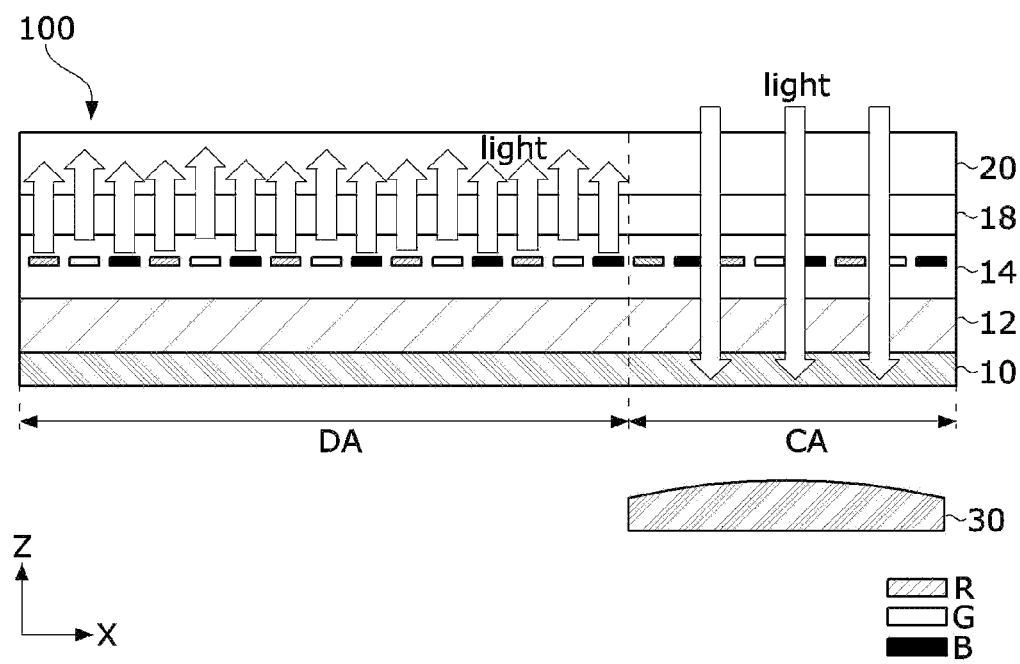
FIG. 3 is a schematic cross-sectional view illustrating a display panel according to the embodiment of the present disclosure.
Figure 4:
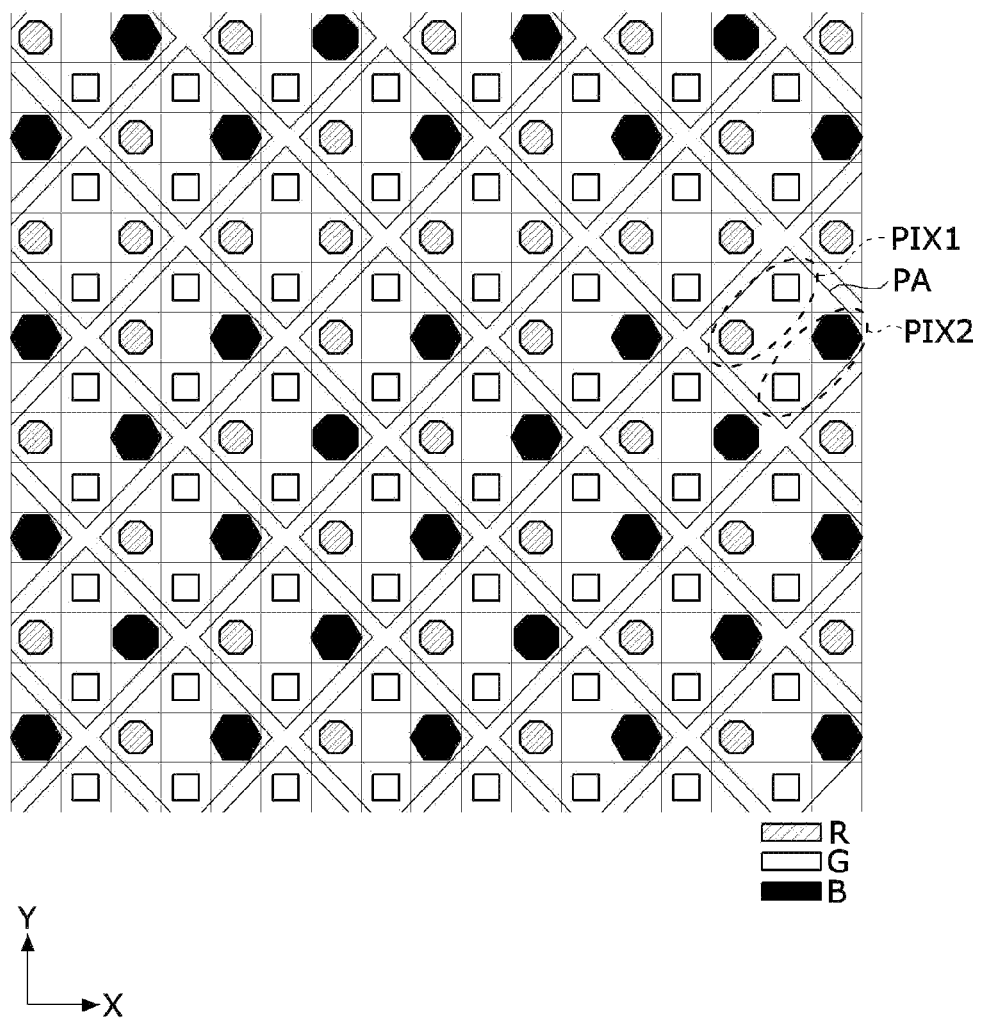
FIG. 4 is a view illustrating a pixel arrangement in a display region according to one embodiment of the present disclosure.

FIG. 1 is a conceptual diagram of a display device according to one embodiment of the present disclosure, FIGS. 2A to 2D are views illustrating various arrangement positions and shapes of a second display region according to one embodiment, FIG. 3 is a schematic cross-sectional view illustrating a display panel according to the embodiment of the present disclosure, and FIG. 4 is a view illustrating a pixel arrangement in a display region according to one embodiment of the present disclosure.

Referring to FIG. 1, the display device may include a display panel 100 and a case, and a front surface of the display panel 100 may be configured as a display region. Thus, a full-screen display may be implemented.

The display region may include a first display region DA and a second display region CA. The first display region DA and the second display region CA may all output an image but may be different in resolution. As an example, a resolution of a plurality of second pixels disposed in the second display region CA may be less than a resolution of a plurality of first pixels disposed in the first display region DA. A sufficient amount of light may be injected into electronic devices 41 and 42 disposed in the second display region CA by as much as the resolution lowered in the plurality of second pixels disposed in the second display region CA.

However, the present disclosure is not necessarily limited thereto, and the resolution of the first display region DA and the resolution of the second display region CA may be substantially the same.

The second display region CA may be a region in which one or more electronic devices 41 and 42 are disposed. The second display region CA is a region that overlaps various electronic devices and thus may be smaller in area than that of the first display region DA outputting most of the image.

The electronic devices 41 and 42 may include at least one of an image sensor, an infrared sensor, a proximity sensor, an illumination sensor, a gesture sensor, a motion sensor, a fingerprint recognition sensor, and a biometric sensor. As an example, a first electronic device 41 may be an illumination sensor and a second electronic device 42 may be an image sensor configured to capture an image or a video, but the present disclosure is not necessarily limited thereto.

Referring to FIGS. 2A to 2D, the second display region CA may be disposed at various portions to which the light needs to be incident. As an example, the second display region CA may be disposed on a left upper end of the display region as shown in FIG. 2A, the second display region CA may be disposed on a right upper end of the display region as shown in FIG. 2B, the second display region CA may be disposed on an entire upper end of the display region as shown in FIG. 2C, and a width of the second display region CA may be variously modified as shown in FIG. 2D. However, the present disclosure is not necessarily limited thereto, and the second display region CA may be disposed at a central portion of the display region or disposed on a lower end of the display region.

Referring to FIGS. 3 and 4, the first display region DA and the second display region CA may include a pixel array in which pixels, to which pixel data is written, are disposed. The number of pixels per unit area (pixels per inch (PPI)) of the second display region CA may be lower than that of the first display region DA in order to ensure the light transmittance of the second display region CA. However, the present disclosure is not necessarily limited thereto, and the PPI of each of the first display region DA and the second display region CA may be formed in the same or similar manner.

In the second display region CA, external light may pass through the display panel 100 through the light-transmitting regions having a high light transmittance and may be received by a sensor placed under the display panel 100.

Since both the first display region DA and the second display region CA include the pixels, an input image may be reproduced on the first display region DA and the second display region CA.

Each of the pixels of the first display region DA and the second display region CA may include sub-pixels having different colors to implement a color of an image. The subpixels may include red (red sub-pixel), green (green sub-pixel), and blue (blue sub-pixel). Although not shown in the drawings, each of the pixels may further include a white sub-pixel. Each of the sub-pixels disposed in the pixel region may include a pixel circuit and a light-emitting element (organic light-emitting diode (OLED)).

The second display region CA may include the pixels and a camera module disposed under a screen of the display panel 100. The pixels of the second display region CA may display an input image by writing pixel data of an input image in a display mode.

The camera module may capture the external image in the imaged mode to output a picture or video image data. A lens of the camera module may face the second display region CA.

The external light is incident on a lens 30 of the camera module through the second display region CA, and the lens 30 may condense light to an image sensor that is omitted from the drawing. The camera module may capture the external image in the imaged mode to output a picture or video image data.

The display panel 100 has a width in an X-axis direction, a length in a Y-axis direction, and a thickness in a Z-axis direction. The display panel 100 may include a circuit layer 12 disposed on a substrate 10, and a light-emitting element layer 14 disposed on the circuit layer 12. A polarizing plate 18 may be disposed on the light-emitting element layer 14, and a cover glass 20 may be disposed on the polarizing plate 18.

The circuit layer 12 may include the pixel circuit connected to lines such as data lines, gate lines, power lines, and the like, a gate driving unit connected to the gate lines, and the like.

The circuit layer 12 may include a circuit element such as a transistor implemented as a thin-film transistor (TFT), a capacitor, and the like. The lines and circuit elements of the circuit layer 12 may be implemented with a plurality of insulating layers, two or more metal layers separated from each other with the insulating layers therebetween, and an active layer including a semiconductor material.

The light-emitting element layer 14 may include the light-emitting element driven by the pixel circuit. The light-emitting element may be implemented as an OLED. The OLED may include an organic compound layer formed between an anode and a cathode.

The organic compound layer may include a hole injection layer HIL, a hole transport layer HTL, an emission layer EML, an electron transport layer ETL, and an electron injection layer EIL, but the present disclosure is not limited thereto.

When a voltage is applied to the anode and the cathode of the OLED, holes passing through the hole transport layer HTL and electrons passing through the electron transport layer ETL move to the emission layer EML to create excitons, and thus visible light may be emitted from the emission layer EML.

The light-emitting element layer 14 may further include a color filter array disposed on the pixels that selectively transmit red, green, and blue wavelengths.

The light-emitting element layer 14 may be covered by a protective film, and the protective film may be covered by an encapsulation layer.

The protective film and the encapsulation layer may have a structure in which organic films and inorganic films are alternately stacked. The inorganic films may block the penetration of moisture or oxygen. The organic films may planarize a surface of the inorganic film.

When the organic films and the inorganic films are stacked in multiple layers, the penetration of moisture/oxygen affecting the light-emitting element layer 14 may be effectively blocked or at least reduced since a movement path of the moisture or oxygen is increased in length as compared with a single layer.

The polarizing plate 18 may be adhered to the encapsulation layer. The polarizing plate 18 can improve the outdoor visibility of the display device. The polarizing plate 18 may reduce the reflection of light from a surface of the display panel 100 and block or at least reduce the light reflected from metal of the circuit layer 12, thereby improving the brightness of the pixels. The polarizing plate 18 may be implemented as a linear polarizing plate and a polarizing plate to which a phase retardation film is bonded, or a circular polarizing plate.

Referring to FIG. 4, the first display region DA may include pixels PIX1 and PIX2 arranged in a matrix form. Each of the pixels PIX1 and PIX2 may be implemented as a real-type pixel in which R, G, and B sub-pixels of three primary colors form one pixel.

Each of the pixels PIX1 and PIX2 may further include a W sub-pixel omitted from the drawing. In addition, two sub-pixels may form one pixel using a sub-pixel rendering algorithm. For example, a first pixel PIX1 may include R and G sub-pixels, and a second pixel PIX2 may include B and G sub-pixels. Insufficient color representation in each of the pixels PIX1 and PIX2 may be compensated with an average value of pieces of corresponding color data between neighboring pixels.

Figure 5:
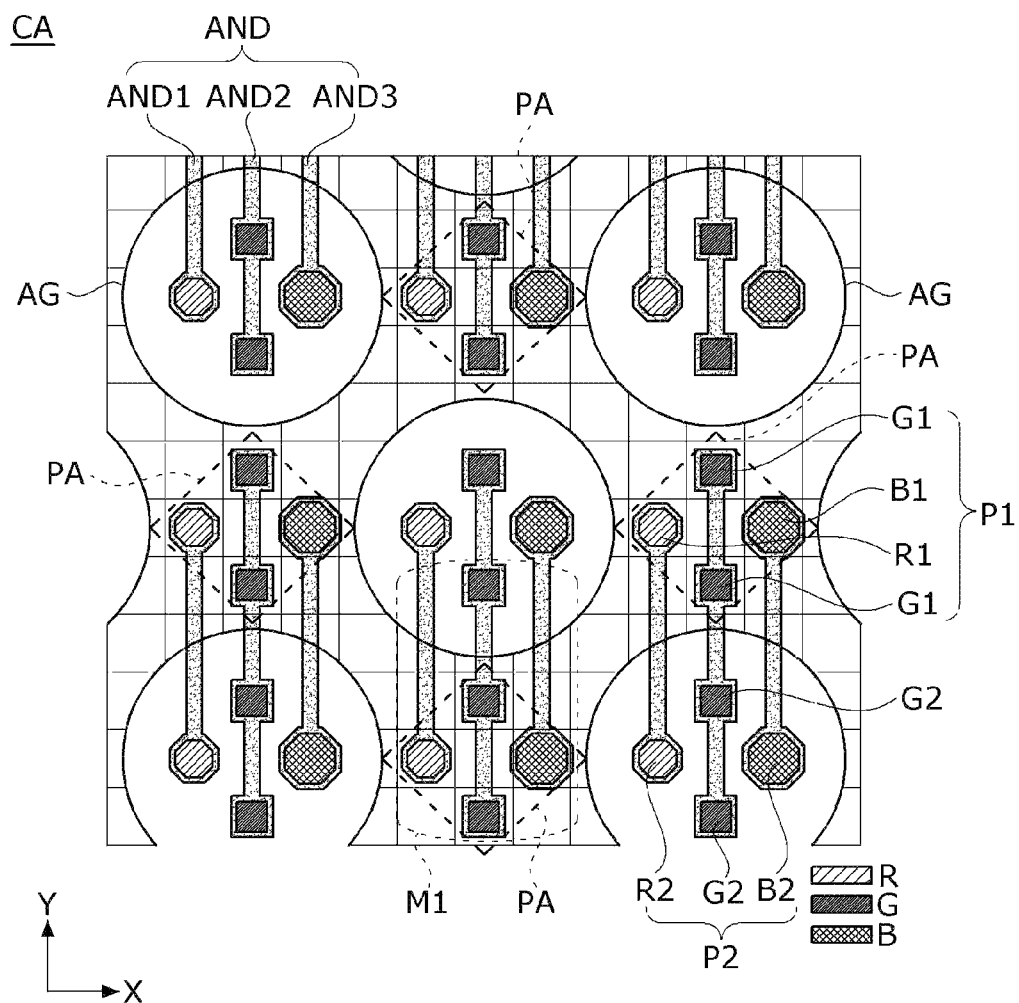
FIG. 5 is a view illustrating pixels of a second display region and light-transmitting regions according to a first embodiment of the present disclosure.
Figure 6:
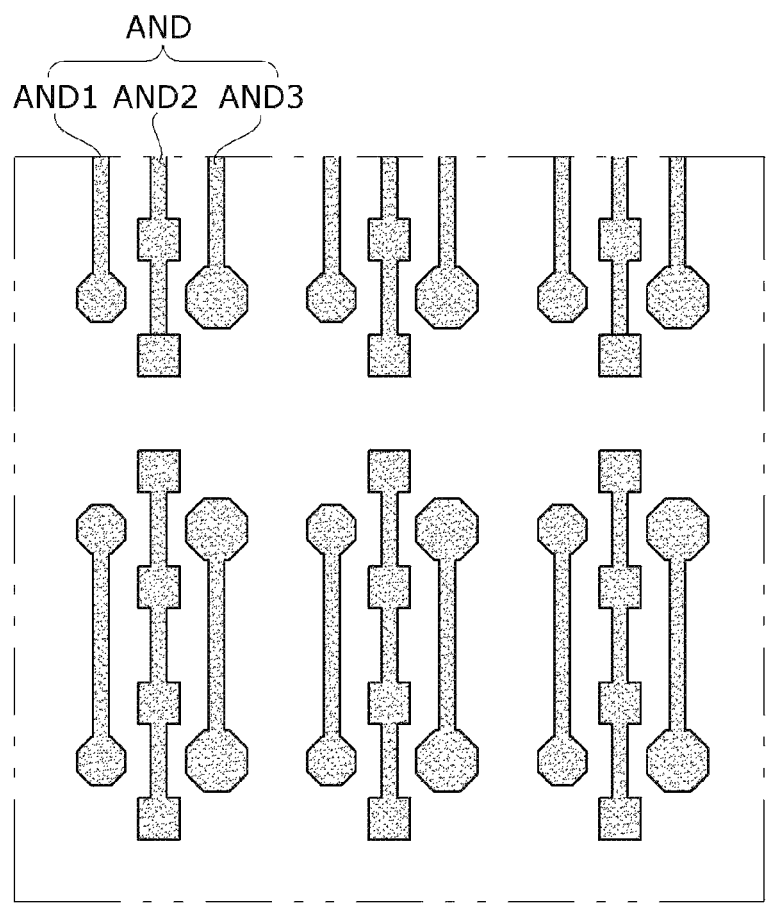
FIG. 6 is a plan view illustrating first electrodes disposed in the second display region according to one embodiment.
Figure 7:
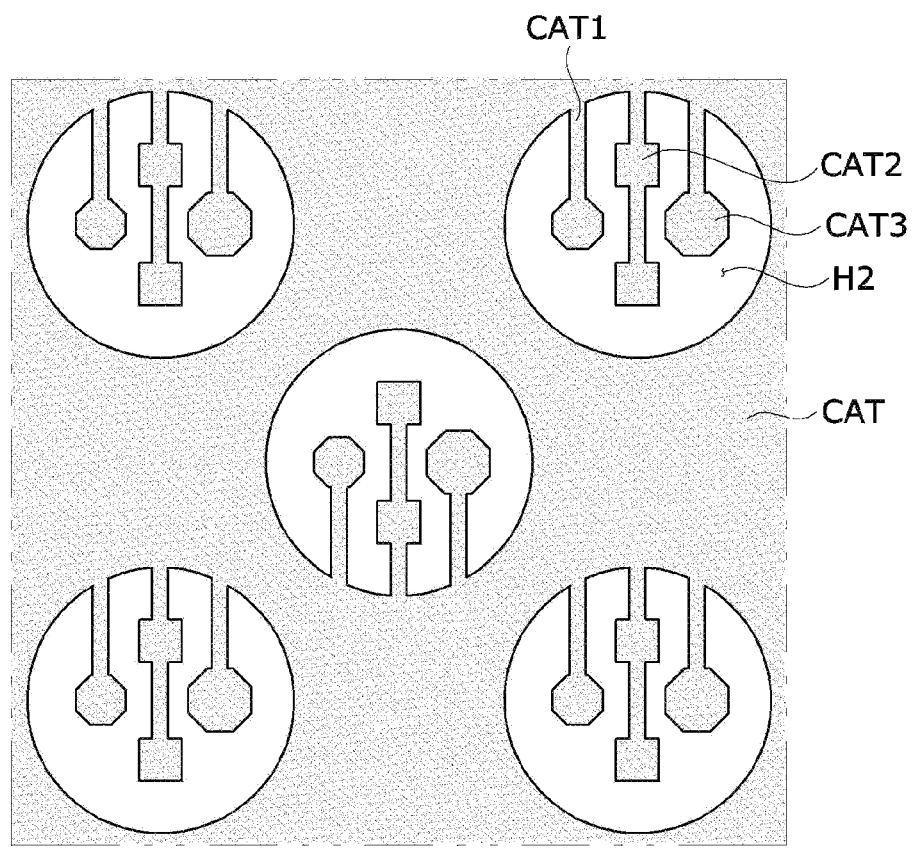
FIG. 7 is a plan view illustrating a second electrode disposed in the second display region according to one embodiment.
Figure 8:
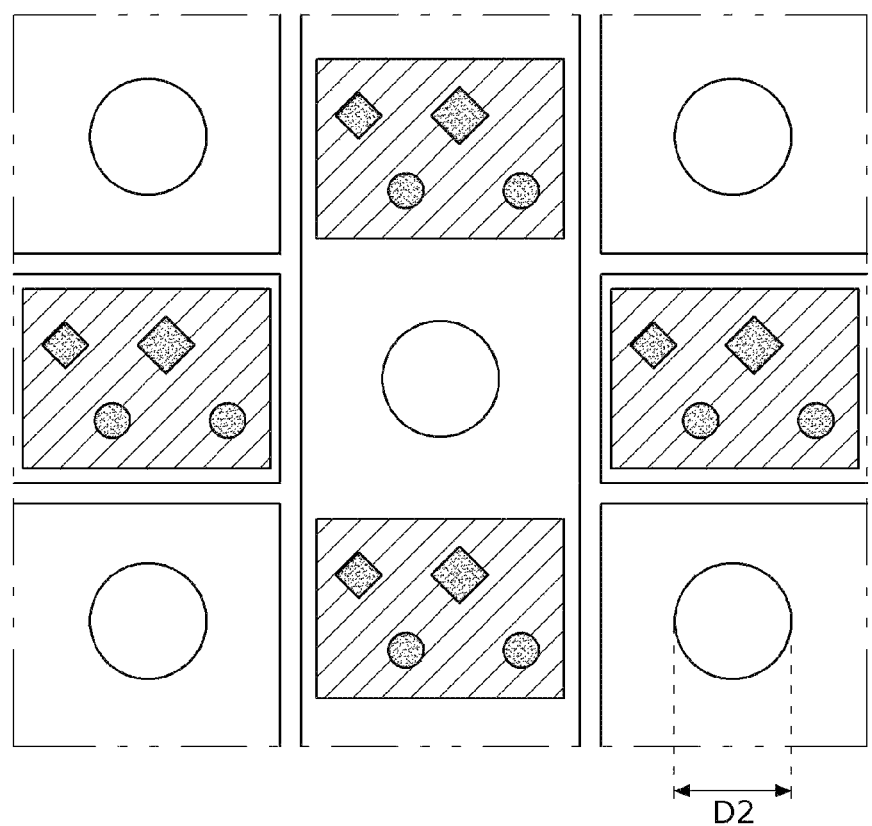
FIG. 8 is a view illustrating a conventional imaged region.

FIG. 5 is a view illustrating pixels of a second display region and light-transmitting regions according to a first embodiment of the present disclosure, FIG. 6 is a plan view illustrating first electrodes disposed in the second display region according to one embodiment, FIG. 7 is a plan view illustrating a second electrode disposed in the second display region according to one embodiment, and FIG. 8 is a view illustrating a conventional imaged region.

Referring to FIGS. 5 and 6, a second display region CA may include a plurality of pixel regions PA and a plurality of light-transmitting regions AG disposed between the plurality of pixel regions PA. The light-transmitting region AG may include transparent media having a high light transmittance without having metal so that light may be incident at a minimum light loss. The light-transmitting region AG may be defined as a region made of transparent insulating materials without including metal lines or pixels. As the light-transmitting region AG becomes larger, the light transmittance of the second display region CA may be higher.

The shape of the light-transmitting region AG is illustrated in a circular shape, but the present disclosure is not limited thereto. For example, the light-transmitting region AG may be designed in various shapes such as a circular shape, an elliptical shape, a polygonal shape, or the like.

Pixels disposed in the second display region CA may include first pixels P1 disposed in the plurality of pixel regions PA and second pixels P2 disposed in the plurality of light-transmitting regions AG. According to the embodiment, the pixels may also be disposed in the light-transmitting region AG. Thus, a substantial light-transmitting area of the light-transmitting region AG may be an area excluding an area of the region in which the second pixels P2 are disposed.

According to the embodiment, since pixels are disposed in the light-transmitting region AG, the number of pixels per unit area (PPI) of the second display region CA may be the same as that of the first display region DA. In this case, the pixels may be formed at one time using one fine metal mask (FMM) in the first display region DA and the second display region CA, thereby reducing manufacturing costs and shortening manufacturing time.

First electrodes AND disposed in the plurality of pixel regions PA and connected to the plurality of first pixels P1 may extend to the light-transmitting region AG to be electrically connected to the plurality of second pixels P2. Thus, pixel data applied to the first pixels P1 through the first electrodes AND may be equally applied to the second pixels P2 due to the first electrodes AND.

Accordingly, an image output from the first pixels P1 of the pixel region PA may be the same as an image output from the second pixels P2 of the light-transmitting region AG. That is, the first pixel may be a driving pixel including a pixel circuit and a light-emitting element (OLED), while the second pixel P2 may be a dummy pixel of the first pixel P1, which includes only a light-emitting element (OLED).

According to this configuration, the second pixel P2 also emits light together with the first pixel P1 when the first pixel P1 is driven, so that a light-emitting area is increased, thereby increasing the luminance. In addition, the resolution of the second display region CA may also be improved. As the resolution increases, the deviation of pixel data values applied between neighboring pixels may not be great, and thus, in terms of resolution, it may be more advantageous to output similar image as compared with the case in which there are no neighboring pixels. When a predetermined region including the first pixel and the second pixel outputs the same image, the resolution may be further increased.

In general, when the number of pixels per unit area of the second display region CA is less than the number of pixels per unit area of the first display region DA, the luminance of the second display region CA may be less than that of the first display region DA. Thus, in order to compensate for luminance of the second display region CA, a higher data voltage may be applied to the pixels of the second display region CA, but in this case, there is a problem that the light-emitting element (OLED) may be damaged.

However, according to the embodiment, since the number of pixels per unit area of the first display region DA is the same as or similar to that of the second display region CA, there is no need to further increase the voltage level applied to the pixels of the second display region CA. Thus, the lifespan of the element may be improved.

The first electrode AND may include a first sub-electrode AND1 connecting a first sub-pixel R1 of the pixel region PA to a first dummy pixel R2 of the light-transmitting region AG, a second sub-electrode AND2 connecting a second sub-pixel G1 of the pixel region PA to a second dummy pixel G2 of the light-transmitting region AG, and a third sub-electrode AND3 connecting a third sub-pixel B1 of the pixel region PA to a third dummy pixel B2 of the light-transmitting region AG.

In this case, a length of the first sub-electrode AND1 and a length of the third sub-electrode AND3 may be the same, and a length of the second sub-electrode AND2 may be greater than the length of each of the first sub-electrode AND1 and the third sub-electrode AND3.

The first to third sub-electrodes AND1 to AND3 extend in one direction and electrically connect the first pixel P1 to the second pixel P2. Thus, the first electrode AND is increased in area, so that current density may be lowered to improve the lifespan of the light-emitting element.

The first electrode AND may be made of various metal materials having excellent conductivity, but may be made of a transparent electrode having excellent light transmittance. In the case in which the first electrode AND is manufactured as a transparent electrode, light transmittance may be increased in the light-transmitting region AG. The transparent electrode may be made of a metal oxide such as ITO or IZO, but the present disclosure is not necessarily limited thereto.

Referring to FIG. 7, a second electrode CAT, which is connected to the first pixels P1 and the second pixels P2, may cover the pixel regions PA and include a plurality of openings H2 corresponding to the plurality of light-transmitting regions AG. Since the second electrode CAT is formed entirely on the second display region CA, a material having high conductivity may be selected. Thus, since the light transmittance is relatively low, it may be desirable to form the opening H2 corresponding to the light-transmitting region AG. In the embodiment, the light-transmitting region AG may be defined as a region corresponding to the opening H2 of the second electrode CAT.

However, the present disclosure is not necessarily limited thereto, and when the second electrode CAT is manufactured as a transparent electrode, the light transmittance in the light-transmitting region AG may be increased. A metal oxide such as ITO or IZO may be applied to the transparent electrode, but the present disclosure is not necessarily limited thereto.

The second electrode CAT may include a plurality of sub-electrodes CAT1, CAT2, and CATS extending to the plurality of light-transmitting regions AG to electrically connect the plurality of first pixels P1 and the plurality of second pixels P2, respectively.

The first electrodes AND and the second electrode CAT may each have a shape corresponding to each other and overlap in a vertical direction on the plurality of light-transmitting regions AG.

Referring to FIG. 8, since conventional second display regions CA are arranged in the order of RGBG, a pixel region is relatively widened, and thus there is a problem that a diameter D2 of each light-transmitting region AG decreases. However, according to the embodiment, the pixel regions are compactly arranged in a square shape, so that the diameter of the light-transmitting region may be manufactured to be relatively wide. Thus, a light-transmitting area similar to an area of the conventional light-transmitting region may be secured even when the pixels are arranged in the light-transmitting region as in the embodiment and the light-transmitting area is partially reduced.

Figure 9:
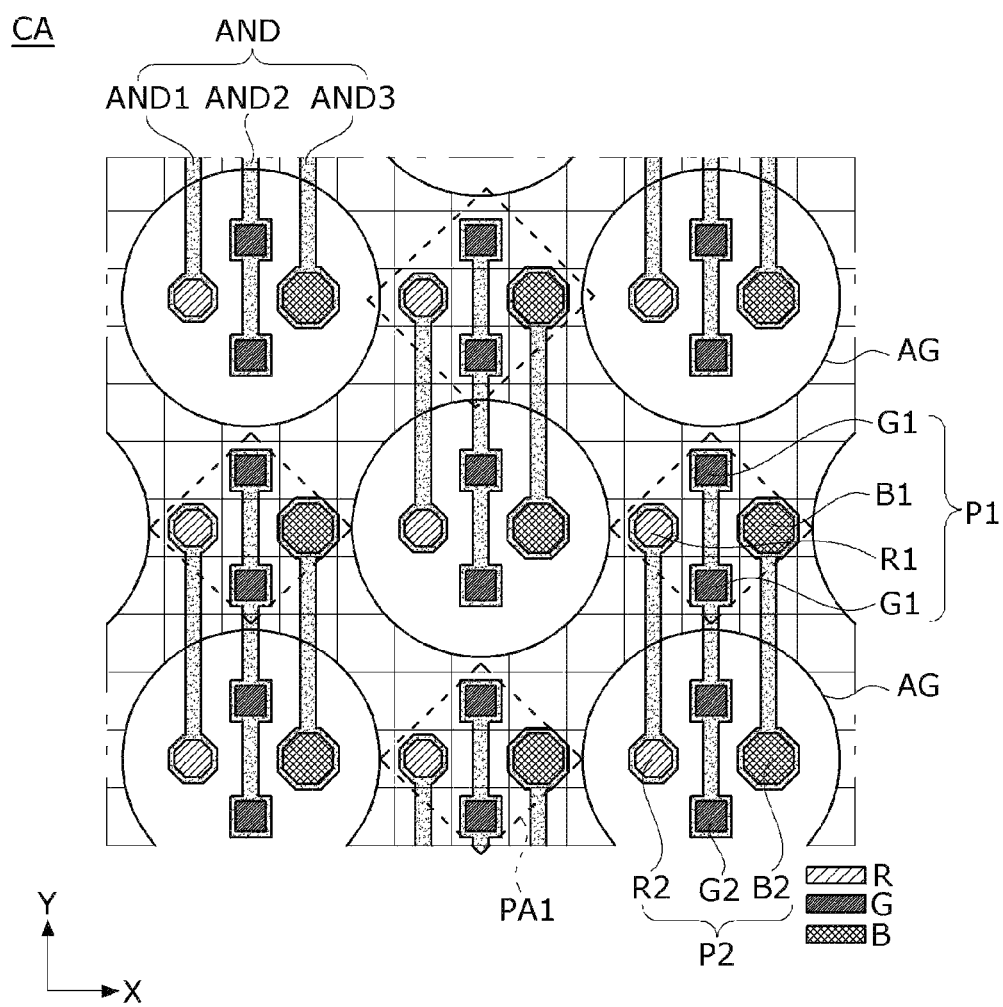
FIG. 9 is a view illustrating pixels of a second display region and light-transmitting regions according to a second embodiment of the present disclosure.
Figure 10:
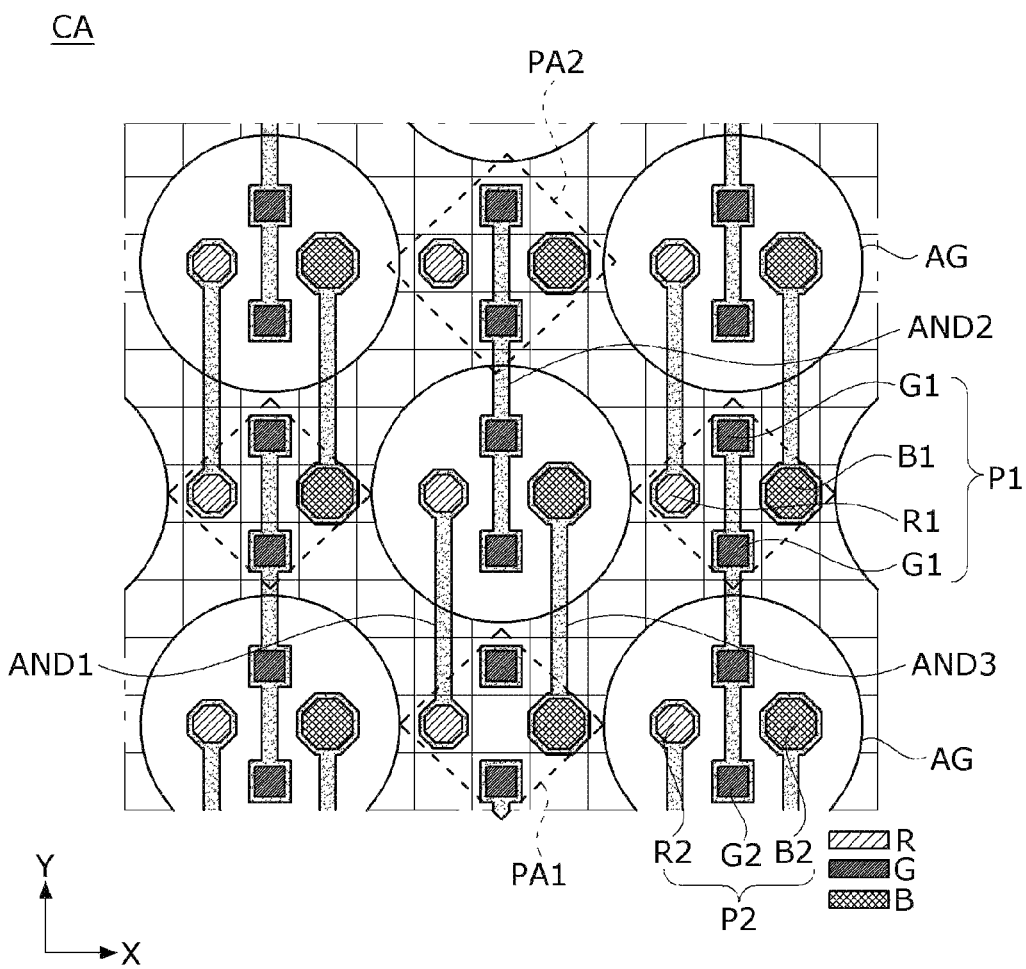
FIG. 10 is a view illustrating pixels of a second display region and light-transmitting regions according to a third embodiment of the present disclosure.

FIG. 9 is a view illustrating pixels of a second display region and light-transmitting regions according to a second embodiment of the present disclosure, and FIG. 10 is a view illustrating pixels of a second display region and light-transmitting regions according to a third embodiment of the present disclosure.

Referring to FIG. 9, a second pixel P2 disposed in a light-transmitting region AG may include a first dummy pixel R2, a second dummy pixel G2, and a third dummy pixel B2. As an example, the first dummy pixel R2 may be a red pixel, the second dummy pixel G2 may be a green pixel, and the third dummy pixel B2 may be a blue pixel, but the present disclosure is not necessarily limited thereto.

The first dummy pixel R2 of the second pixel P2 may be electrically connected to a first sub-pixel R1 of a first pixel region PA1 among a plurality of pixel regions PA surrounding the light-transmitting region AG.

The second dummy pixel G2 of the second pixel P2 may be electrically connected to a second sub-pixel G1 of the first pixel region PA1. In addition, the third dummy pixel B2 of the second pixel P2 may be electrically connected to a third sub-pixel B1 of the first pixel region PA1.

That is, the dummy pixels R2, G2, and B2 of the second pixel P2 may be electrically connected to the sub-pixels R1, G1, and B1 of the first pixel region PA1, respectively. Thus, when the first pixel P1 outputs an input image, the second pixel P2 may also output the same image. The terms of the dummy pixel and the sub-pixel are used just to distinguish them, and the dummy pixel and the sub-pixel may all be sub-pixels forming an RGB pixel group.

The number of pixel regions PA surrounding any one light-transmitting region AG is not specifically limited. In FIG. 9, it is illustrated that four pixel regions PA surround one light-transmitting region AG, but the present disclosure is not necessarily limited thereto, and six or eight or more pixel regions PA may be disposed to surround one light-transmitting region AG. That is, the number of the surrounding pixel regions PA may vary depending on the size of the light-transmitting region AG.

Referring to FIG. 10, a first dummy pixel R2 of a second pixel P2 may be electrically connected to a first sub-pixel R1 of a first pixel region PA1 among a plurality of pixel regions PA surrounding a light-transmitting region AG.

In addition, a third dummy pixel B2 of the second pixel P2 may be electrically connected to a third sub-pixel B1 of the first pixel region PA1 surrounding the light-transmitting region AG.

However, a second dummy pixel G2 of the second pixel P2 may be electrically connected to a second sub-pixel G1 of a second pixel region PA2 surrounding the light-transmitting region AG.

That is, the first and third dummy pixels R2 and B2 of the second pixel P2 may connected to the first pixel region PA1, while the second dummy pixel G2 of the second pixel P2 may be connected to the second pixel region PA2. Thus, the second pixel P2 disposed in a first light-transmitting region AG may output an image different from those in the neighboring pixel regions PA.

According to such a configuration, the light-transmitting region AG disposed between the first pixel region PA1 and the second pixel region PA2 may output an image in which an image output from the first pixel P1 and an image output from the second pixel P2 are mixed. Thus, resolution and luminance may be increased as compared with the case in which no image is output from the light-transmitting region AG at all.

Figure 11:
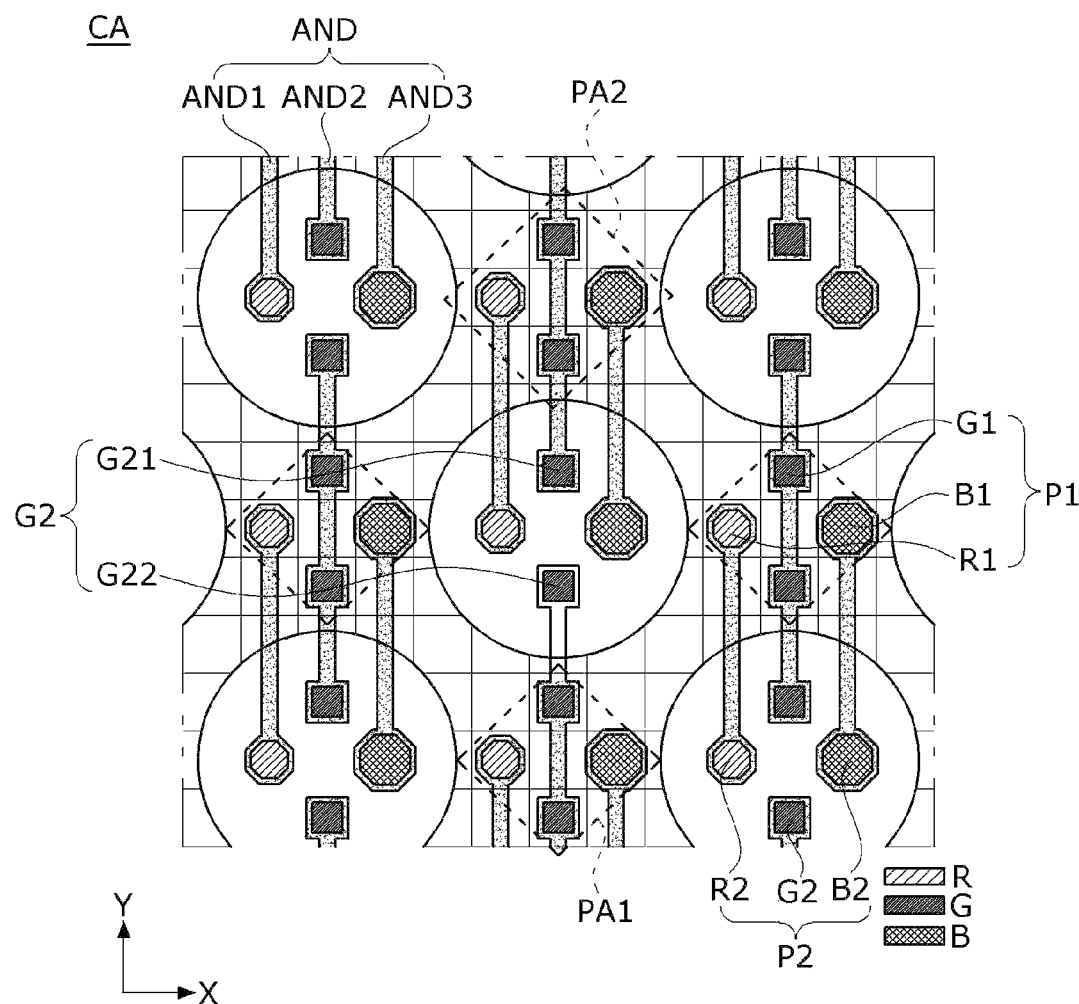
FIG. 11 is a view illustrating pixels of a second display region and light-transmitting regions according to a fourth embodiment of the present disclosure.
Figure 12:
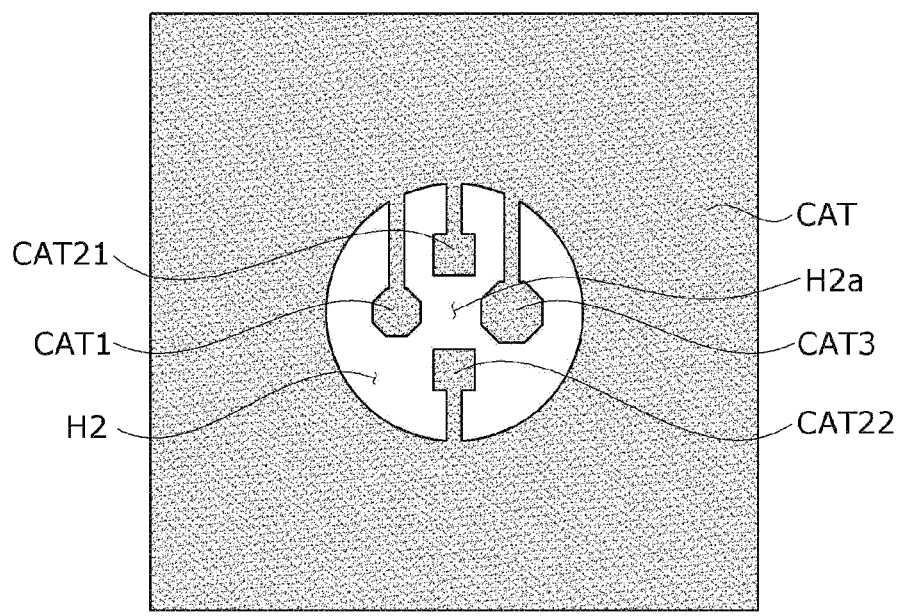
FIG. 12 is a plan view illustrating a second electrode according to the fourth embodiment of the present disclosure.

FIG. 11 is a view illustrating pixels of a second display region and light-transmitting regions according to a fourth embodiment of the present disclosure, and FIG. 12 is a plan view illustrating a second electrode according to the fourth embodiment of the present disclosure.

Referring to FIGS. 11 and 12, a second dummy pixel G2 may include a first unit dummy pixel G21 and a second unit dummy pixel G22. The second dummy pixel G2 may be a green pixel. A green pixel has the greatest influence on luminance, and thus may be implemented in multiple numbers. In addition, a plurality of green pixels may be provided to implement pixels in a matrix form. However, the present disclosure is not necessarily limited thereto, and the first unit dummy pixel G21 and the second unit dummy pixel G22 may be white sub-pixels.

The first unit dummy pixel G21 may be electrically connected to a second sub-pixel G1 of a second pixel region PA2 among a plurality of pixel regions PA surrounding a light-transmitting region AG, and the second unit dummy pixel G22 may be electrically connected to a second sub-pixel G1 of a first pixel region PA1 among the plurality of pixel regions PA surrounding the light-transmitting region AG. Alternatively, connections opposite to the above may also be made.

Sub-electrodes of a second electrode CAT may include a first unit sub-electrode CAT21 corresponding to the first unit dummy pixel G21 and a second unit sub-electrode CAT22 corresponding to the second unit dummy pixel G22. In this case, the first unit sub-electrode CAT21 and the second unit sub-electrode CAT22 may be spaced apart from each other. Thus, since the second electrode CAT is not disposed in a central region H2a of an opening H2, an area of the light-transmitting region AG may be further widened. Accordingly, an incident amount of light is relatively increased and thus camera performance may be improved.

Figure 13:
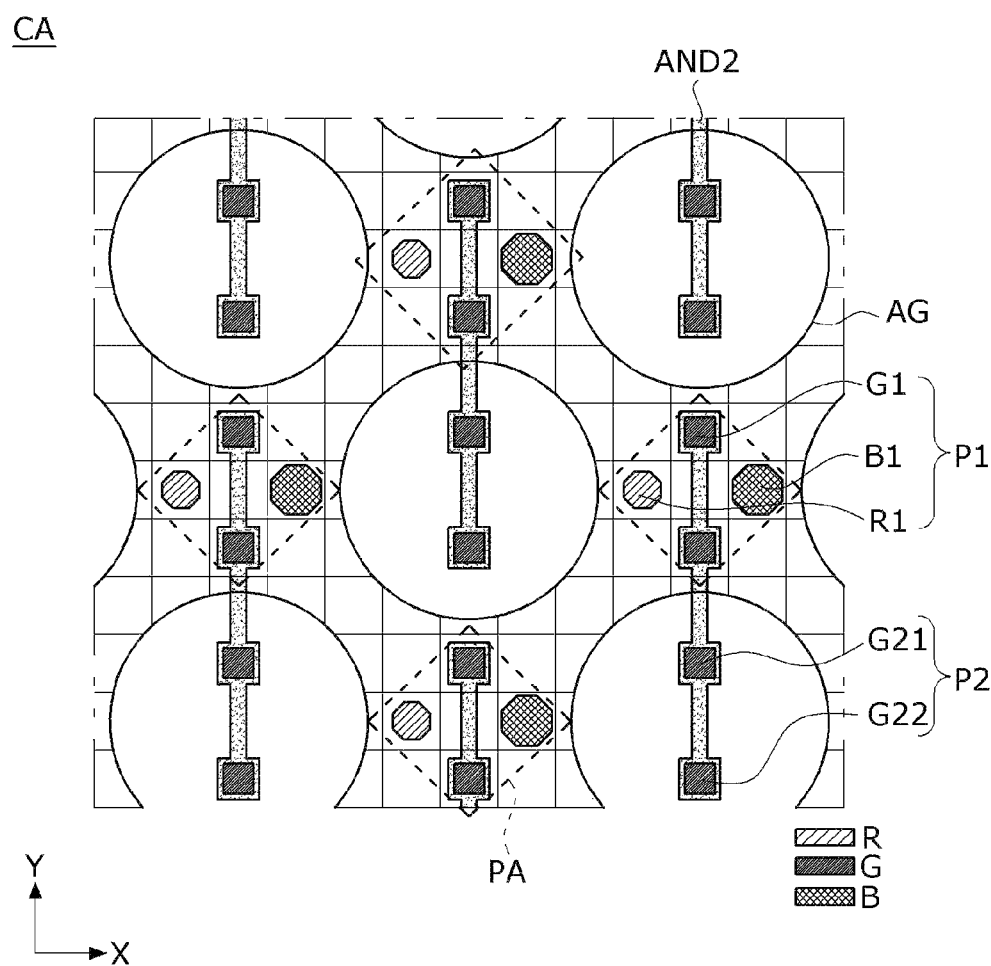
FIG. 13 is a view illustrating pixels of a second display region and light-transmitting regions according to a fifth embodiment of the present disclosure.
Figure 14:
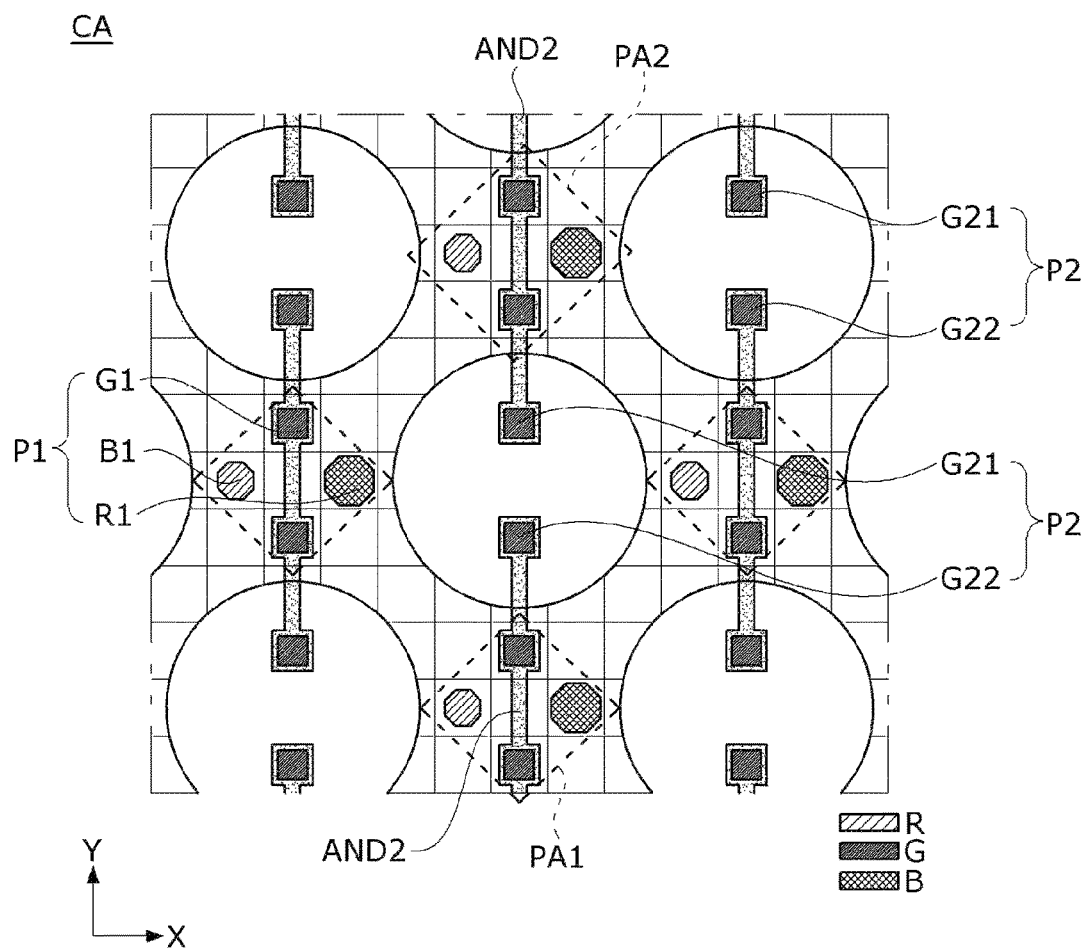
FIG. 14 is a view illustrating pixels of a second display region and light-transmitting regions according to a sixth embodiment of the present disclosure.

FIG. 13 is a view illustrating pixels of a second display region and light-transmitting regions according to a fifth embodiment of the present disclosure, and FIG. 14 is a view illustrating pixels of a second display region and light-transmitting regions according to a sixth embodiment of the present disclosure.

Referring to FIG. 13, a second display region CA according to the embodiment may be implemented with only sub-pixels of a single color. As an example, a second pixel P2 may be formed of only green pixels that are most sensitive to luminance.

In the present embodiment, the second pixel P2 is formed of only green pixels to improve luminance, while red pixels and blue pixels may be omitted, thereby increasing an area of a light-transmitting region AG. That is, since a first electrode AND and a second electrode CAT for connecting a red pixel or blue pixel to the light-transmitting region AG may be omitted, the area of the light-transmitting region AG may be increased.

However, the present disclosure is not necessarily limited thereto, and when a first pixel P1 and the second pixel P2 include white sub-pixels, the second pixel P2 may be a white sub-pixel.

Referring to FIG. 14, a first unit dummy pixel G21 may be electrically connected to a second sub-pixel G1 of a second pixel region PA2 among a plurality of pixel regions PA surrounding a light-transmitting region AG, and a second unit dummy pixel G22 may be electrically connected to a second sub-pixel G1 of a first pixel region PA1 among the plurality of pixel regions PA surrounding the light-transmitting region AG.

According to such a structure, since a second electrode CAT is not disposed in a middle region between the first unit dummy pixel G21 and the second unit dummy pixel G22, an area of the light-transmitting region AG may be widened. Accordingly, an incident amount of light is relatively increased and thus camera performance may be further improved.

Figure 15:
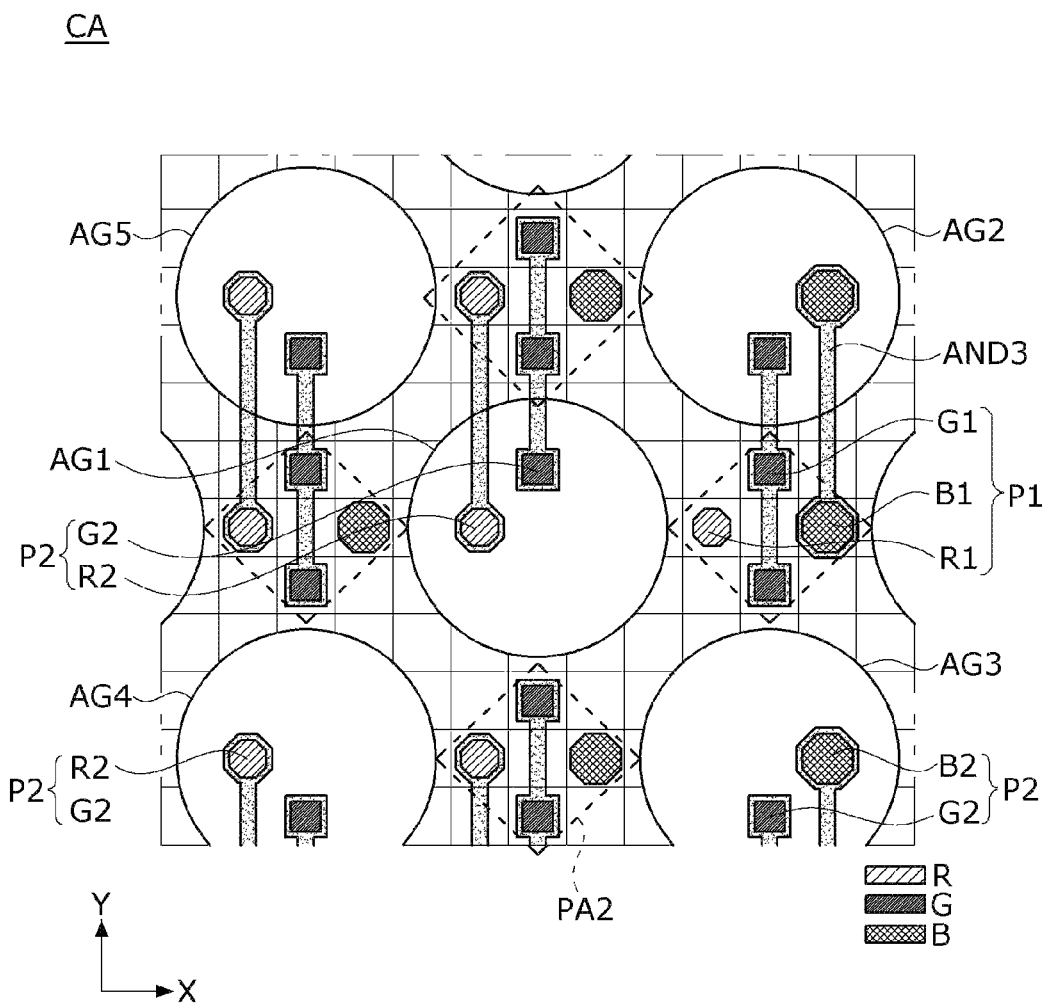
FIG. 15 is a view illustrating pixels of a second display region and light-transmitting regions according to a seventh embodiment of the present disclosure.

FIG. 15 is a view illustrating pixels of a second display region and light-transmitting regions according to a seventh embodiment of the present disclosure.

Referring to FIG. 15, a second pixel P2 may be configured in a form in which at least one of a red pixel, a green pixel, and a blue pixel is omitted.

As an example, a red pixel R2 and a green pixel G2 may be disposed in a first light-transmitting region AG1 disposed at a center of the drawing, and may each be electrically connected to a sub-pixel of a pixel region PA. According to such a configuration, all of the red pixel R2, the green pixel G2, and a blue pixel B2 may emit light in the pixel region PA, whereas only the red pixel R2 and the green pixel G2 may emit light in the first light-transmitting region AG1.

In addition, a green pixel and a blue pixel may be disposed in a second light-transmitting region AG2, which is disposed in a 1 o'clock direction with respect to the first light-transmitting region AG1, and a third light-transmitting region AG3 disposed in a 5 o'clock direction with respect to the first light-transmitting region AG1. In addition, the red pixel and the green pixel may be disposed in a fourth light-transmitting region AG4, which is disposed in a 7 o'clock direction with respect to the first light-transmitting region AG1, and a fifth light-transmitting region AG5 disposed in an 11 o'clock direction with respect to the first light-transmitting region AG1. However, the present disclosure is not necessarily limited thereto, and different sub-pixels may be randomly disposed in each light-transmitting region.

According to the embodiment, different sub-pixels may be disposed in the neighboring light-transmitting regions AG to improve the overall luminance, and a light-emitting area of the light-transmitting region AG may be increased to improve display performance.

Further, an area of the light-transmitting region AG may be widened as compared with the case in which a red pixel, a green pixel, and a blue pixel are disposed in all of the light-transmitting regions AG, thereby improving camera performance.

Figure 16:
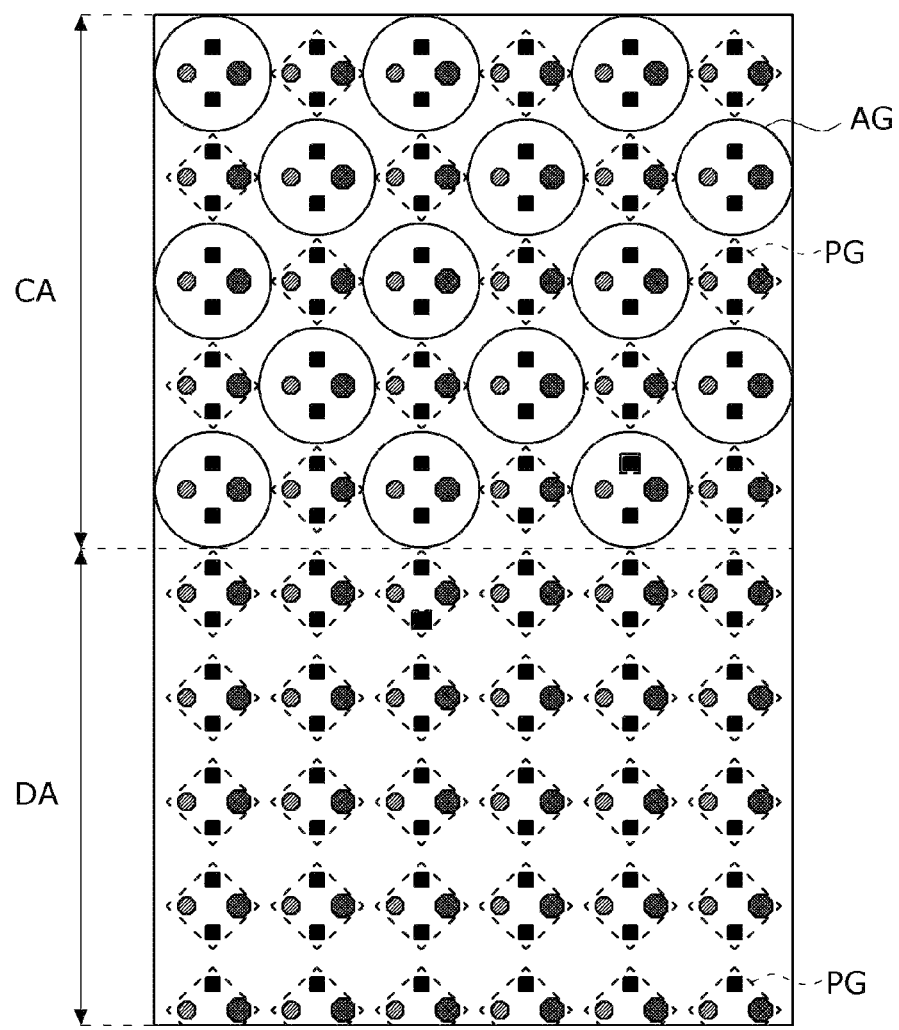
FIG. 16 is a view illustrating pixels of a first display region and a second display region according to one embodiment.

FIG. 16 is a view illustrating pixels of a first display region and a second display region according to one embodiment.

Referring to FIG. 16, the number of pixels per unit area may be the same in a first display region DA and a second display region CA. Thus, when pixels are formed using an FMM mask, there is an advantage that the pixels in the first display region DA and the second display region CA may use the same FMM mask.

According to such a configuration, one FMM mask may be used as it is so that there is an advantage that manufacturing costs and manufacturing time are reduced, the second display region CA also has the same light-emitting area as the first display region DA so that a full display may be implemented, and the light-emitting area is increased so that a lifespan of the pixel in the second display region CA may be improved.

However, the present disclosure is not necessarily limited thereto, and the number of pixels of the second display region CA may be variously adjusted. As an example, the number of pixels disposed in the light-transmitting region AG may be reduced as a distance from the first display region DA increases.

The second pixels may be disposed in all of the light-transmitting regions AG at a boundary between the first display region DA and the second display region CA so that a boundary region between the first display region DA and the second display region CA may not be visible. When the number of pixels is abruptly changed at the boundary between the first display region DA and the second display region CA, due to a difference in resolution, the boundary of the second display region CA may be visible.

Further, as the distance from the first display region DA increases, the number of pixels of the light-transmitting region AG may be reduced. According to such a configuration, the number of pixels disposed in the light-transmitting region AG decreases as it goes to a region in which a camera is disposed, so that the amount of incident light may increase.

Figure 17:
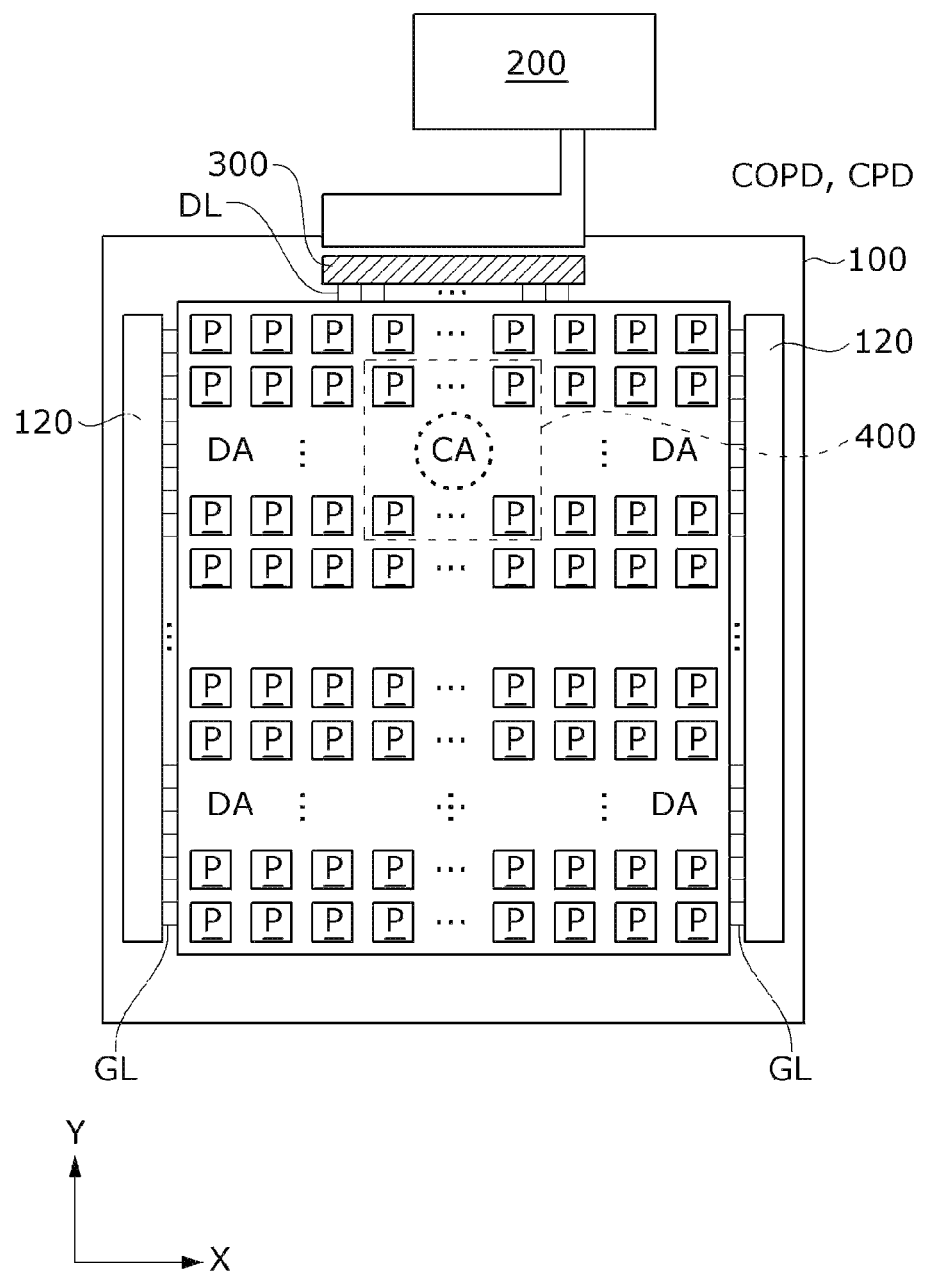
FIG. 17 is a block diagram illustrating a display panel and a display panel driving unit according to an embodiment of the present disclosure.
Figure 18:
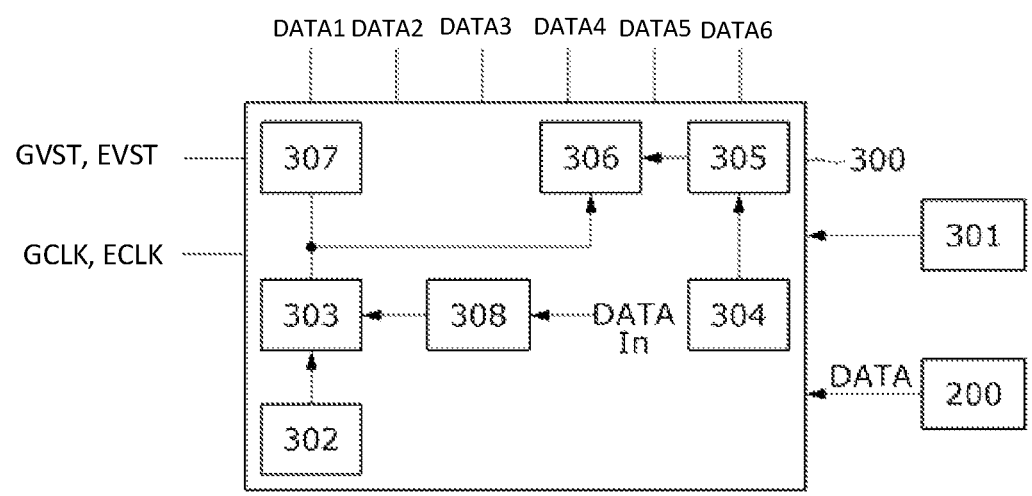
FIG. 18 is a schematic block diagram illustrating a configuration of a driver integrated circuit (IC) according to one embodiment.

FIG. 17 is a block diagram illustrating a display panel and a display panel driving unit according to an embodiment of the present disclosure, and FIG. 18 is a schematic block diagram illustrating a configuration of a driver integrated circuit (IC).

Referring to FIGS. 17 and 18, the display device may include a display panel 100 having a pixel array disposed on a screen, a display panel driving unit, and the like.

The pixel array of the display panel 100 may include data lines DL, gate lines GL intersecting the data lines DL, and pixels P arranged in a matrix form defined by the data lines DL and the gate lines GL. The pixel array may further include power lines such as a VDD line PL1, a Vini line PL2, a VSS line PL3, and the like illustrated in FIG. 20.

The pixel array may be divided into a circuit layer 12 and a light-emitting element layer 14 as shown in FIG. 3. A touch sensor array may be disposed on the light-emitting element layer 14. Each of the pixels of the pixel array may include two to four sub-pixels, as described above. Each of the sub-pixels may include a pixel circuit disposed on the circuit layer 12.

In the display panel 100, the screen on which an input image is reproduced may include a first display region DA and a second display region CA.

Each sub-pixel of each of the first display region DA and the second display region CA may include a pixel circuit. The pixel circuit may include a driving element configured to supply current to a light-emitting element OLED, a plurality of switch elements configured to sample a threshold voltage of the driving element and switch current paths of the pixel circuit, a capacitor configured to maintain a gate voltage of the driving element, and the like. The pixel circuit may be disposed under the light-emitting element.

The second display region CA may include light-transmitting regions AG disposed between pixel groups and a camera module 400 disposed under the second display region CA. In an imaged mode, the camera module 400 may perform a photoelectric conversion on light incident through the second display region CA using an image sensor and convert pixel data of an image, which is output from the image sensor, into digital data to output imaged image data.

The display panel driving unit may write the pixel data of the input image to the pixels P. The pixels P may be interpreted as a pixel group including a plurality of sub-pixels.

The display panel driving unit may include a data driving unit 306 configured to supply a data voltage of the pixel data to the data lines DL, and a gate driving unit 120 configured to sequentially supply a gate pulse to the gate lines GL. The data driving unit 306 may be integrated into a driver IC 300. The display panel driving unit may further include a touch sensor driving unit omitted from the drawing.

The driver IC 300 may be attached to the display panel 100. The driver IC 300 receives pixel data of an input image and a timing signal from a host system 200, supplies a data voltage of the pixel data to the pixels, and synchronizes the data driving unit 306 with the gate driving unit 120.

The driver IC 300 may be connected to the data lines DL through data output channels to supply the data voltage of the pixel data to the data lines DL. The driver IC 300 may output a gate timing signal for controlling the gate driving unit 120 through gate timing signal output channels.

The gate timing signal generated from a timing controller 303 may include a gate start pulse VST, a gate shift clock CLK, and the like. The gate start pulse VST and the gate shift clock CLK may swing between a gate-on voltage VGL and a gate-off voltage VGH.

The gate timing signal (VST and CLK) output from a level shifter 307 may be applied to the gate driving unit 120 to control a shift operation of the gate driving unit 120.

The gate driving unit 120 may include a shift register formed on the circuit layer of the display panel 100 together with the pixel array. The shift register of the gate driving unit 120 may sequentially supply a gate signal to the gate lines GL under the control of the timing controller. The gate signal may include a scan pulse and an EM pulse of an emission signal.

The shift register may include a scan driving unit configured to output the scan pulse, and an EM driving unit configured to output the EM pulse. In FIG. 18, "GVST" and "GCLK" are signals included in the gate timing signal that is input to the scan driving unit. "EVST" and "ECLK" are signals included in the gate timing signal that is input to the EM driving unit.

The driver IC 300 may be connected to the host system 200, a first memory 301, and the display panel 100. The driver IC 300 may include a data reception and computation unit 308, the timing controller 303, the data driving unit 306, a gamma compensation voltage generation unit 305, a power supply unit 304, a second memory 302, and the like.

The data reception and computation unit 308 may include a reception unit configured to receive pixel data input as a digital signal from the host system 200 and a data computation unit configured to process the pixel data input through the reception unit to improve image quality.

The data computation unit may include a data restoration unit configured to perform restoration by decoding compressed pixel data, an optical compensation unit configured to add a preset optical compensation value to the pixel data, and the like. The optical compensation value may be set as a value for compensating for luminance of each piece of pixel data based on the luminance of the screen that is measured on the basis of a camera image captured in a manufacturing process.

The timing controller 303 may provide the pixel data of the input image received from the host system 200 to the data driving unit 306. The timing controller 303 may generate a gate timing signal for controlling the gate driving unit 120 and a source timing signal for controlling the data driving unit 306 to control operation timing of the gate driving unit 120 and the data driving unit 306.

The data driving unit 306 may convert digital data including the pixel data received from the timing controller 303 into a gamma compensation voltage using a digital-to-analog converter (DAC) and output a data voltage. The data voltage output from the data driving unit 306 may be supplied to the data lines DL of the pixel array through an output buffer connected to a data channel of the driver IC 300.

The gamma compensation voltage generation unit 305 may generate a gamma compensation voltage for each grayscale by dividing a gamma reference voltage received from the power supply unit 304 through a voltage divider circuit. The gamma compensation voltage is an analog voltage in which a voltage is set for each grayscale of the pixel data. The gamma compensation voltage output from the gamma compensation voltage generation unit 305 may be provided to the data driving unit 306.

The power supply unit 304 may generate power necessary to drive the driver IC 300, the gate driving unit 120, and the pixel array of the display panel 100 using a DC-DC converter. The DC-DC converter may include a charge pump, a regulator, a buck converter, a boost converter, and the like.

The power supply unit 304 may generate DC voltages such as a gamma reference voltage, a gate-on voltage VGL, a gate-off voltage VGH, a pixel driving voltage VDD, a low-potential power supply voltage VSS, an initialization voltage Vini, and the like by adjusting a DC input voltage received from the host system 200.

The gamma reference voltage may be supplied to the gamma compensation voltage generation unit 305. The gate-on voltage VGL and the gate-off voltage VGH may be supplied to the level shifter 307 and the gate driving unit 120. Pixel power voltages such as the pixel driving voltage VDD, the low-potential power supply voltage VSS, and the initialization voltages Vini may be supplied in common to the pixels P.

The initialization voltage Vini may be set to a DC voltage that is lower than the pixel driving voltage VDD and is lower than a threshold voltage of the light-emitting element OLED to initialize main nodes of the pixel circuits and suppress light emission of the light-emitting element OLED.

When power is supplied to the driver IC 300, the second memory 302 may store a compensation value, register setting data, and the like that are received from the first memory 301.

The compensation value may be applied to various algorithms for improving image quality. The compensation value may include the optical compensation value. The register setting data may define operations of the data driving unit 306, the timing controller 303, the gamma compensation voltage generation unit 305, and the like. The first memory 301 may include a flash memory. The second memory 302 may include a static random-access memory (SRAM).

The host system 200 may be implemented as an application processor (AP). The host system 200 may transmit the pixel data of the input image to the driver IC 300 through a mobile industry processor interface (MIPI). The host system 200 may be connected to the driver IC 300 through a flexible printed circuit, for example, a flexible printed circuit (FPC).

The display panel 100 may be implemented as a flexible panel applicable to a flexible display. The flexible display may have a screen that is variable in size by rolling, folding, or bending the flexible panel and may be easily manufactured with various designs.

The flexible display may be implemented as a rollable display, a foldable display, a bendable display, a slidable display, or the like.

The flexible panel may be manufactured as a so-called a "plastic OLED panel." The plastic OLED panel may include a back plate and a pixel array formed on an organic thin film adhered to the back plate. A touch sensor array may be formed on the pixel array.

The back plate may be a polyethylene terephthalate (PET) substrate. The pixel array and the touch sensor array may be formed on the organic thin film. The back plate may block the permeation of moisture to the organic thin film so that the pixel array is not exposed to moisture.

The organic thin film may be a polyimide (PI) substrate. A multilayer buffer film may be formed of an insulating material (not shown) on the organic thin film. The circuit layer 12 and the light-emitting element layer 14 may be stacked on the organic thin film.

In the display device of the present disclosure, the pixel circuit and the gate driving unit disposed on the circuit layer 12 may include a plurality of transistors. The transistors may be implemented as oxide thin-film transistors (TFTs) including an oxide semiconductor, low-temperature polysilicon (LTPS) TFTs including LTPS, and the like. Each of the transistors may be implemented as a p-channel thin-film transistor (TFT) or an n-channel TFT. The following embodiments will be described focusing on an example in which the transistors of the pixel circuit are implemented as p-channel TFTs, but the present disclosure is not limited thereto.

The transistors are three-electrode elements including a gate, a source, and a drain. The source is an electrode that provides carriers to the transistor. The carriers in the transistor may start to flow from the source. The drain is an electrode through which the carriers are discharged from the transistor to the outside.

In the transistor, carriers flow from the source to the drain. In the case of an n-channel transistor, carriers are electrons, and thus a source voltage is lower than a drain voltage so that the electrons flow from the source to the drain. In the n-channel transistor, current flows from the drain to the source.

In the case of a p-channel transistor (PMOS), carriers are holes, and thus a source voltage is higher than a drain voltage so that the holes flow from the source to the drain. In the p-channel transistor, since the holes flow from the source to the drain, current flows from the source to the drain. It should be noted that the source and the drain of the transistor are not fixed in position. For example, the source and the drain are interchangeable depending on the applied voltage. Accordingly, the present disclosure is not limited by the source and the drain of the transistor. In the following description, the source and the drain of the transistor will be referred to as a first electrode and a second electrode.

A gate pulse may swing between a gate-on voltage and a gate-off voltage. The gate-on voltage may be set to be higher than a threshold voltage of the transistor, and the gate-off voltage may be set to be lower than the threshold voltage of the transistor.

The transistor may be turned on in response to the gate-on voltage and turned off in response to the gate-off voltage. In the case of an n-channel transistor, the gate-on voltage may be a gate-high voltage VGH, and the gate-off voltage may be a gate-low voltage VGL. In the case of a p-channel transistor, the gate-on voltage may be a gate-low voltage VGL, and the gate-off voltage may be a gate-high voltage VGH.

The driving element of the pixel circuit may be implemented as a transistor. The driving element should have uniform electrical characteristics between all the pixels, but there may be differences in electrical characteristics between the pixels due to a process variation and an element characteristic variation, and the electrical characteristics may vary as a display driving time passes.

In order to compensate for the electrical characteristic variation of the driving element, the display device may include an internal compensation circuit and an external compensation circuit. The internal compensation circuit may be added to the pixel circuit in each of the subpixels to sample a threshold voltage Vth and/or a mobility μ of the driving element, which vary according to the electrical characteristics of the driving element, and compensate for the variation in real time.

The external compensation circuit may transmit the threshold voltage and/or mobility of the driving element, which are sensed through the sensing line connected to each of the subpixels, to an external compensation unit. The external compensation unit of the external compensation circuit may reflect the sensing result to modulate the pixel data of the input image, thereby compensating for the variation in the electrical characteristics of the driving element.

A voltage of the pixel, which varies according to electrical characteristics of the driving element, may be sensed, and data of an input image may be modulated in the external compensation circuit based on the sensed voltage, thereby compensating for the variation in the electrical characteristics of the driving element between the pixels.

Figure 19:
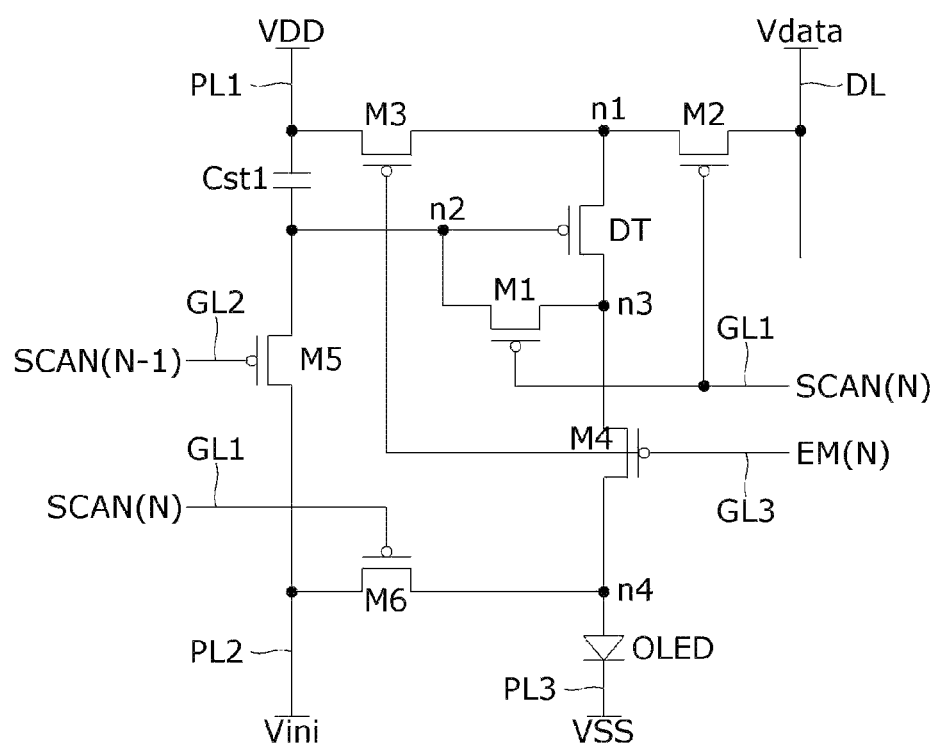
FIG. 19 is a circuit diagram illustrating an example of a pixel circuit according to one embodiment.
Figure 20:
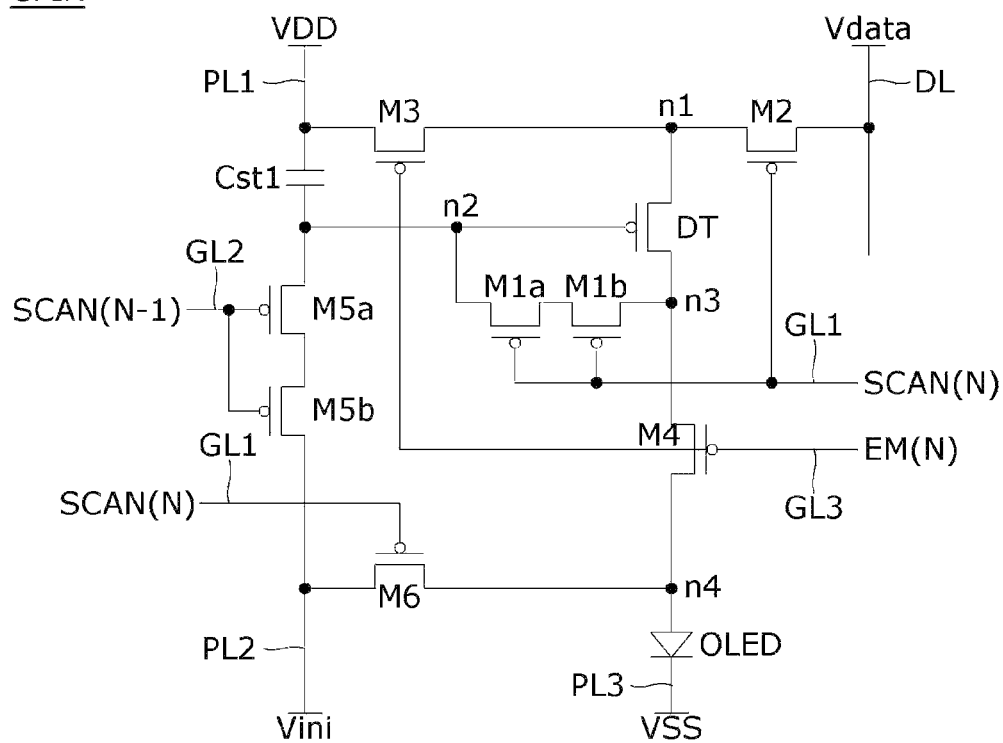
FIG. 20 is a circuit diagram illustrating another example of the pixel circuit according to one embodiment.
Figure 21:
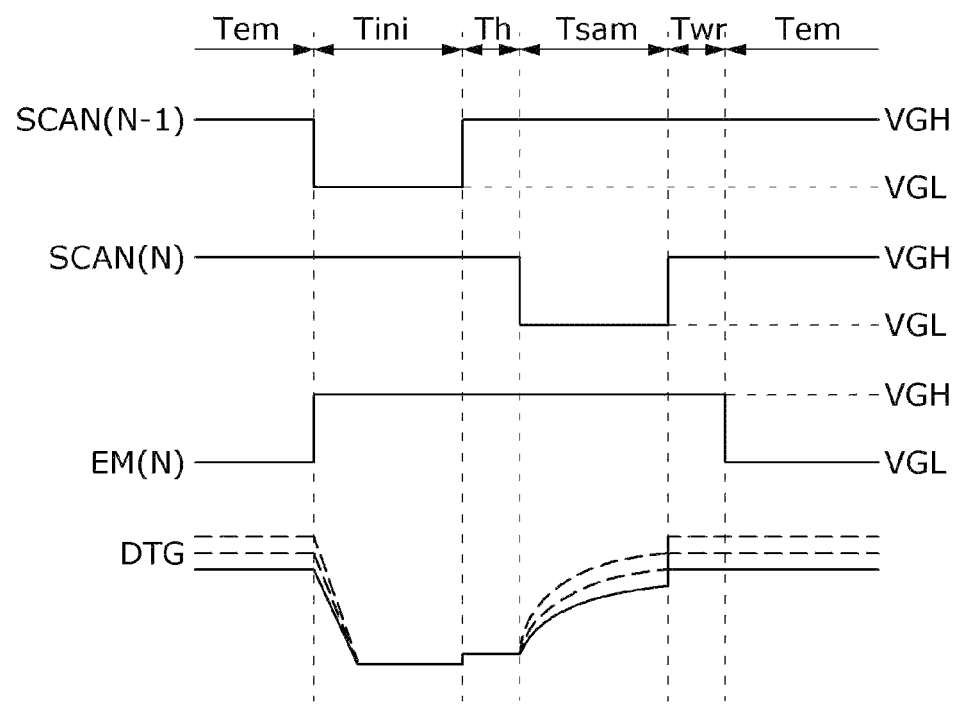
FIG. 21 is a diagram illustrating a method of driving the pixel circuits shown in FIGS. 19 and 20 according to one embodiment.

FIG. 19 is a circuit diagram illustrating an example of the pixel circuit, and FIG. 20 is a circuit diagram illustrating another example of the pixel circuit. FIG. 21 is a diagram illustrating a method of driving the pixel circuits shown in FIGS. 19 and 20 according to one embodiment.

The pixel circuits shown in FIGS. 19 and 20 may be similarly applied to the pixel circuit of the first display region DA and the second display region CA. The pixel circuit applicable to the present disclosure may be implemented as the circuits shown in FIGS. 19 and 20, but the present disclosure is not limited thereto.

Referring to FIGS. 19 to 21, the pixel circuit may include a light-emitting element OLED, a driving element DT configured to supply current to the light-emitting element OLED, and an internal compensation circuit configured to sample a threshold voltage Vth of the driving element DT using a plurality of switch elements M1 to M6 and compensate for a gate voltage of the driving element DT by as much as the threshold voltage Vth of the driving element DT. Each of the driving element DT and the switch elements M1 to M6 may be implemented as a p-channel TFT.

A driving period of the pixel circuit using the internal compensation circuit may be divided into an initialization period Tini, a sampling period Tsam, a data writing period Twr, and a light emission period Tem, as shown in FIG. 21.

During the initialization period Tini, an N-lth scan signal SCAN(N-1) is generated as a pulse of a gate-on voltage VGL, and a voltage of each of an Nth scan signal SCAN(N) and an emission signal EM(N) is a gate-off voltage VGH. During the sampling period Tsam, the Nth scan signal SCAN(N) is generated as a pulse of the gate-on voltage VGL, and a voltage of each of the N-lth scan signal SCAN(N-1) and the emission signal EM(N) is the gate-off voltage VGH. During the data writing period Twr, a voltage of each of the N-lth scan signal SCAN(N-1), the Nth scan signal SCAN(N), and the emission signal EM(N) is the gate-off voltage VGH. During at least a partial period of the light emission period Tem, the emission signal EM(N) may be generated as the gate-on voltage VGL, and a voltage of each of the N-lth scan signal SCAN(N-1) and the Nth scan signal SCAN(N) may be generated as the gate-off voltage VGH.

During the initialization period Tini, a fifth switch element M5 may be turned on according to the gate-on voltage VGL of the N-lth scan signal SCAN(N-1) to initialize the pixel circuit. During the sampling period Tsam, first and second switch elements M1 and M2 may be turned on according to the gate-on voltage VGL of the Nth scan signal SCAN(N) so that the threshold voltage of the driving element DT may be sampled and stored in a storage capacitor Cst1. At the same time, a sixth switch element M6 may be turned on during the sampling period Tsam to lower a voltage of a fourth node n4 to a reference voltage Vref to suppress light emission of the light-emitting element OLED. During the data writing period Twr, the first to sixth switch elements M1 to M6 may be maintained in an OFF state. During the light emission period Tem, the third and fourth switch elements M3 and M4 may be turned on so that the light-emitting element OLED may emit light. In the light emission period Tem, in order to precisely express a luminance of a low grayscale with a duty ratio of the emission signal EM(N), the emission signal EM(N) may swing between the gate-on voltage VGL and the gate-off voltage VGH at a predetermined duty ratio to repeat turning the third and fourth switch elements M3 and M4 on or off.

The light-emitting element OLED may be implemented as an organic light-emitting diode or an inorganic light-emitting diode. Hereinafter, an example in which the light-emitting element OLED is implemented as an organic light-emitting diode will be described.

The light-emitting element OLED may include an organic compound layer formed between an anode and a cathode. The organic compound layer may include a hole injection layer HIL, a hole transport layer HTL, a light-emitting layer EML, an electron transport layer ETL, and an electron injection layer EIL, but the present disclosure is not limited thereto. When a voltage is applied to the anode and the cathode of the OLED, holes passing through the hole transport layer HTL and electrons passing through the electron transport layer ETL move to the emission layer EML to create excitons, and thus visible light may be emitted from the light-emitting layer EML.

The anode of the light-emitting element OLED is connected to the fourth node n4 between the fourth and sixth switch elements M4 and M6. The fourth node n4 is connected to the anode of the light-emitting element OLED, a second electrode of the fourth switch element M4, and a second electrode of the sixth switch element M6. The cathode of the light-emitting element OLED may be connected to the VSS line PL3 to which the low-potential power supply voltage VS S is applied. The light-emitting element OLED may emit light with a current Ids that flows according to a gate-source voltage Vgs of the driving element DT. The third and fourth switch elements M3 and M4 may switch current paths of the light-emitting element OLED.

The storage capacitor Cst1 may be connected between the VDD line PL1 and a second node n2. A data voltage Vdata, which is compensated for by as much as the threshold voltage Vth of the driving element DT, may be charged to the storage capacitor Cst1. Since the data voltage Vdata in each sub-pixel is compensated for by as much as the threshold voltage Vth of the driving element DT, a characteristic deviation of the driving element DT in each sub-pixel may be compensated for.

The first switch element M1 may be turned on in response to the gate-on voltage VGL of the Nth scan signal SCAN(N) to connect a second node n2 to a third node n3. The second node n2 may be connected to a gate electrode of the driving element DT, a first electrode of the storage capacitor Cst1, and a first electrode of the first switch element M1. The third node n3 may be connected to a second electrode of the driving element DT, a second electrode of the first switch element M1, and a first electrode of the fourth switch element M4. A gate electrode of the first switch element M1 is connected to a first gate line GL1 to receive the Nth scan signal SCAN(N). The first electrode of the first switch element M1 may be connected to the second node n2, and the second electrode thereof may be connected to the third node n3.

The first switch element M1 may be turned on only in a very short one horizontal period 1H during which the Nth scan signal SCAN(N) is generated as the gate-on voltage VGL in one frame period and thus may be maintained in an OFF state for about one frame period, and thus a leakage current may be generated in the OFF state of the first switch element M1. In order to suppress or at least reduce the leakage current of the first switch element M1, the first switch element M1 may be implemented as a dual-gate structure transistor having two transistors M1a and M1b connected in series, as shown in FIG. 20.

The second switch element M2 may be turned on in response to the gate-on voltage VGL of the Nth scan signal SCAN(N) to supply the data voltage Vdata to the first node n1. A gate electrode of the second switch element M2 may be connected to the first gate line GL1 to receive the Nth scan signal SCAN(N). A first electrode of the second switch element M2 may be connected to the first node n1. A second electrode of the second switch element M2 may be connected to a data line DL to which the data voltage Vdata is applied. The first node n1 may be connected to the first electrode of the second switch element M2, a second electrode of the third switch element M3, and a first electrode of the driving element DT.

The third switch element M3 may be turned on in response to the gate-on voltage VGL of the emission signal EM(N) to connect the VDD line PL1 to the first node n1. A gate electrode of the third switch element M3 may be connected to a third gate line GL3 to receive the emission signal EM(N). A first electrode of the third switch element M3 may be connected to the VDD line PL1. The second electrode of the third switch element M3 may be connected to the first node n1.

The fourth switch element M4 may be turned on in response to the gate-on voltage VGL of the emission signal EM(N) to connect the third node n3 to the anode of the light-emitting element OLED. A gate electrode of the fourth switch element M4 may be connected to the third gate line GL3 to receive the emission signal EM(N). The first electrode of the fourth switch element M4 may be connected to the third node n3, and the second electrode thereof may be connected to the fourth node n4.

The fifth switch element M5 may be turned on in response to the gate-on voltage VGL of the N-1th scan signal SCAN(N−1) to connect the second node n2 to the Vini line PL2. A gate electrode of the fifth switch element M5 may be connected to a second gate line GL2 to receive the N-1th scan pulse SCAN(N−1). A first electrode of the fifth switch element M5 may be connected to the second node n2, and a second electrode thereof may be connected to the Vini line PL2. In order to suppress or at least reduce a leakage current of the fifth switch element M5, the fifth switch element M5 may be implemented as a dual-gate structure transistor having two transistors M5a and M5b connected in series, as shown in FIG. 20.

The sixth switch element M6 may be turned on in response to the gate-on voltage VGL of the Nth scan signal SCAN(N) to connect the Vini line PL2 to the fourth node n4. A gate electrode of the sixth switch element M6 may be connected to the first gate line GL1 to receive the Nth scan signal SCAN(N). The first electrode of the sixth switch element M6 may be connected to the Vini line PL2, and the second electrode thereof may be connected to the fourth node n4.

The driving element DT may adjust the current Ids, which flows in the light-emitting element OLED according to the gate-source voltage Vgs, to drive the light-emitting element OLED. The driving element DT may include the gate electrode connected to the second node n2, the first electrode connected to the first node n1, and the second electrode connected to the third node n3.

As shown in FIG. 21, the N-1th scan signal SCAN(N−1) may be generated as the gate-on voltage VGL during the initialization period Tini. During the initialization period Tini, the Nth scan signal SCAN(N) and the emission signal EM(N) may each be maintained at the gate-off voltage VGH. Thus, during the initialization period Tini, the fifth switch element M5 may be turned on so that the second node n2 may be initialized to "Vini." A hold period Th may be set between the initialization period Tini and the sampling period Tsam. During the hold period Th, SCAN(N) and EM(N) may be maintained in previous states thereof.

During the sampling period Tsam, the Nth scan signal SCAN(N) may be generated as the gate-on voltage VGL. The Nth scan signal SCAN(N) may be synchronized with the data voltage Vdata of an Nth pixel line. During the sampling period Tsam, the N-1th scan signal SCAN(N−1) and the emission signal EM(N) may each be maintained at the gate-off voltage VGH. Thus, during the sampling period Tsam, the first and second switch elements M1 and M2 may be turned on.

During the sampling period Tsam, a gate voltage DTG of the driving element DT may rise due to a current flowing through the first and second switch elements M1 and M2. When the driving element DT is turned off, the gate voltage DTG is Vdata−|Vth|. In this case, the voltage of the first node n1 is Vdata. During the sampling period Tsam, the gate-source voltage Vgs of the driving element DT is |Vgs|=Vdata−(Vdata−|Vth|)=|Vth|.

During the data writing period Twr, the Nth scan signal SCAN(N) may be inverted to the gate-off voltage VGH. During the data writing period Twr, the N-1th scan signal SCAN(N−1) and the emission signal EM(N) may each be maintained at the gate-off voltage VGH. Thus, during the data writing period Twr, all the switch elements M1 to M6 may be maintained in an OFF state.

During the light emission period Tem, the emission signal EM(N) may be generated as the gate-on voltage VGL. During the light emission period Tem, in order to improve a low grayscale representation, the emission signal EM(N) may be turned on or off at a predetermined duty ratio to swing between the gate-on voltage VGL and the gate-off voltage VGH. Accordingly, the emission signal EM(N) may be generated as the gate-on voltage VGL for at least a partial period of the light emission period Tem.

When the emission signal EM(N) is at the gate-on voltage VGL, a current flows between "VDD" and the light-emitting element OLED so that the light-emitting element OLED may emit light. During the light emission period Tem, the N-1th and Nth scan pulses SCAN(N−1) and SCAN(N) may each be maintained at the gate-off voltage VGH. During the light emission period Tem, the third and fourth switch elements M3 and M4 may be repeatedly turned on and off according to the voltage of the emission signal EM(N). When the emission signal EM(N) is at the gate-on voltage VGL, the third and fourth switch elements M3 and M4 are turned on so that current flows in the light-emitting element OLED. In this case, "Vgs" of the driving element DT satisfies |Vgs|=VDD−(Vdata−|Vth|), and the current flowing in the light-emitting element OLED is K(VDD-Vdata)2. "K" is a constant determined by charge mobility, parasitic capacitance, and a channel capacity of the driving element DT.

Figure 22:
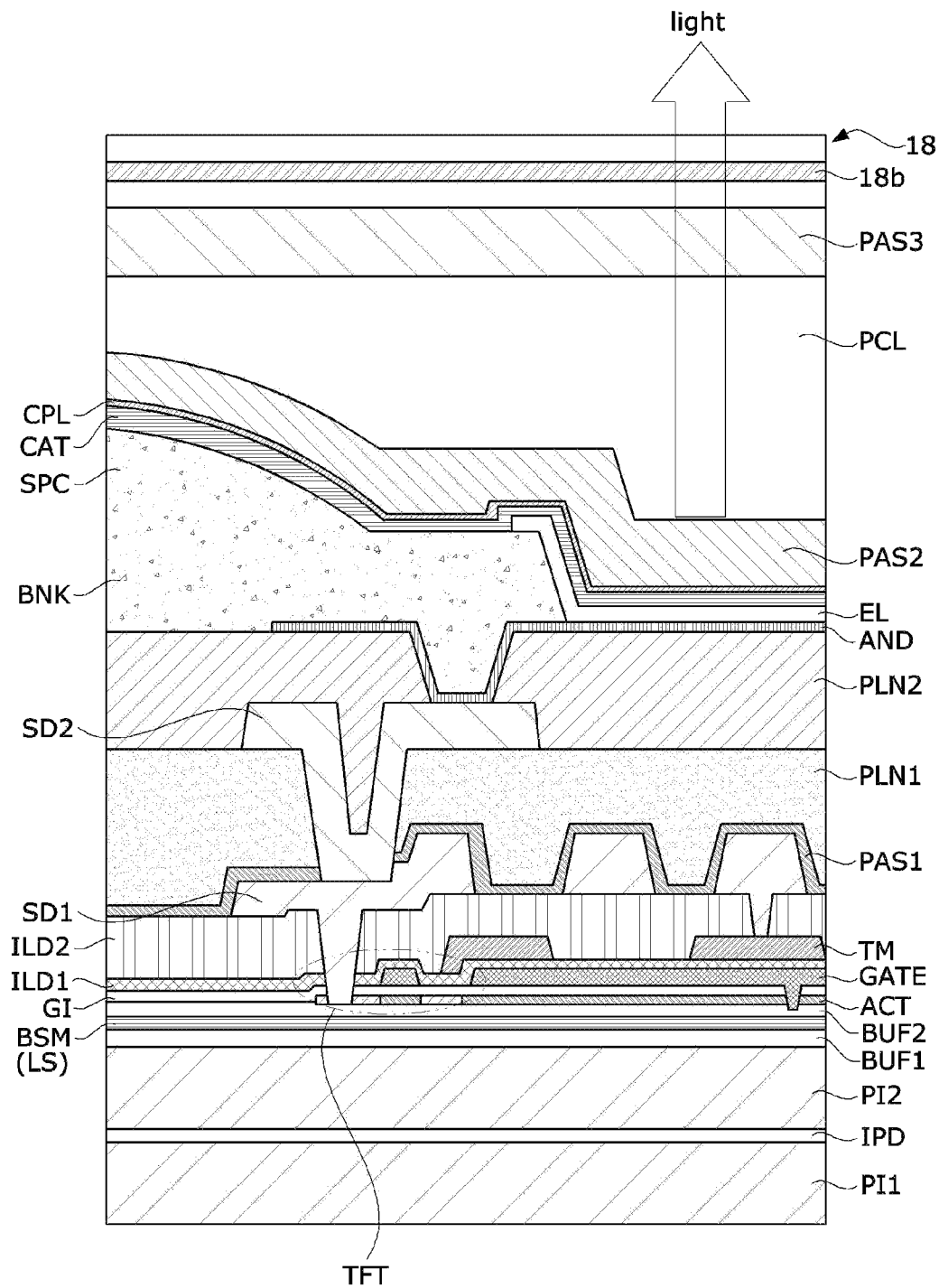
FIG. 22 is a cross-sectional view illustrating a cross-sectional structure of a pixel region in detail in a display panel according to one embodiment of the present disclosure.

FIG. 22 is a cross-sectional view illustrating a cross-sectional structure of a pixel region in detail in a display panel according to one embodiment of the present disclosure.

The cross-sectional structure of the display panel 100 is not limited to that in FIG. 22. In FIG. 22, "TFT" represents a driving element DT of the pixel circuit.

Referring to FIG. 22, a circuit layer, a light-emitting element layer, and the like may be stacked on substrates PI1 and PI2 in a pixel region PIX. The substrates PI1 and PI2 may include a first PI substrate PH and a second PI substrate PI2. An inorganic film IPD may be formed between the first PI substrate PH and the second PI substrate PI2. The inorganic film IPD may block the penetration of moisture.

A first buffer layer BUF1 may be formed on the second PI substrate PI2. A first metal layer may be formed on the first buffer layer BUF1, and a second buffer layer BUF2 may be formed on the first metal layer. The first metal layer may be a first light-blocking layer LS.

Each of the first and second buffer layers BUF1 and BUF2 may be made of an inorganic insulating material and may be formed of one or more insulating layers.

An active layer ACT may be made of a semiconductor material deposited on the second buffer layer BUF2 and may be patterned by a photolithography process. The active layer ACT may include an active pattern of each of TFTs of the pixel circuit and TFTs of the gate driving unit.

A portion of the active layer ACT may be metallized by ion doping. The metallized portion may be used as a jumper pattern connecting the metal layers at some nodes of the pixel circuit to connect components of the pixel circuit.

A gate insulating layer GI may be formed on the second buffer layer BUF2 so as to cover the active layer ACT. The gate insulating layer GI may be made of an inorganic insulating material.

A second metal layer may be formed on the gate insulating layer GI. The second metal layer may be patterned by a photolithography process. The second metal layer may include a gate line, a gate electrode pattern GATE, a lower electrode of the storage capacitor Cst1, a jumper pattern connecting patterns of the first metal layer and a third metal layer, and the like.

A first interlayer insulating layer ILD1 may be formed on the gate insulating layer GI so as to cover the second metal layer. The third metal layer may be formed on the first interlayer insulating layer ILD1, and a second interlayer insulating layer ILD2 may cover the third metal layer.

The third metal layer may be patterned by a photolithography process. The third metal layer may include metal patterns TM, such as an upper electrode of the storage capacitor Cst1. The first and second interlayer insulating layers ILD1 and ILD2 may each include an inorganic insulating material.

A fourth metal layer may be formed on the second interlayer insulating layer ILD2, and an inorganic insulating layer PAS1 and a first planarization layer PLN1 may be stacked on the fourth metal layer. A fifth metal layer may be formed on the first planarization layer PLN1.

Some patterns of the fifth metal layer may be connected to the fourth metal layer through a contact hole passing through the first planarization layer PLN1 and the inorganic insulating layer PAS1. The first and second planarization layers PLN1 and PLN2 may each be made of an organic insulating material enabling surfaces thereof to be flat.

The fourth metal layer may include first and second electrodes of a TFT connected to an active pattern of the TFT through a contact hole passing through the second interlayer insulating layer ILD2. The data line DL and the power lines PL1, PL2, and PL3 may be implemented using a pattern SD1 of the fourth metal layer or a pattern SD2 of the fifth metal layer.

An anode AND, which is a first electrode of the light-emitting element OLED, may be formed on the second planarization layer PLN2. The anode AND may be connected to an electrode of a TFT used as the switch element or the driving element through a contact hole passing through the second planarization layer PLN2. The anode AND may be made of a transparent or semitransparent electrode material.

A pixel-defining film BNK may cover the anode AND of the light-emitting element OLED. The pixel-defining film BNK may be formed in a pattern that defines an emission region (or an opening region) through which light passes to the outside from each of the pixels.

A spacer SPC may be formed on the pixel-defining film BNK. The pixel-defining film BNK and the spacer SPC may be integrated with the same organic insulating material. The spacer SPC may secure a gap between a fine metal mask (FMM) and the anode AND so that the FMM is not in contact with the anode AND in a deposition process of an organic compound EL.

The organic compound EL may be formed in the emission region of each of the pixels, which is defined by the pixel-defining film BNK. A cathode CAT, which is a second electrode of the light-emitting element OLED, may be formed on the entire surface of the display panel 100 so as to cover the pixel-defining film BNK, the spacer SPC, and the organic compound EL.

The cathode CAT may be connected to the VSS line PL3 formed of any one of the metal layers therebelow. A capping layer CPL may cover the cathode CAT. The capping layer CPL may be made of an inorganic insulating material to block the penetration of the air and out-gassing of the organic insulating material, which is applied on the capping layer CPL, to protect the cathode CAT.

An inorganic insulating layer PAS2 may cover the capping layer CPL, and the planarization layer PCL may be formed on the inorganic insulating layer PAS2. The planarization layer PCL may include an organic insulating material. An inorganic insulating layer PASS of the encapsulation layer may be formed on the planarization layer PCL.

Figure 23:
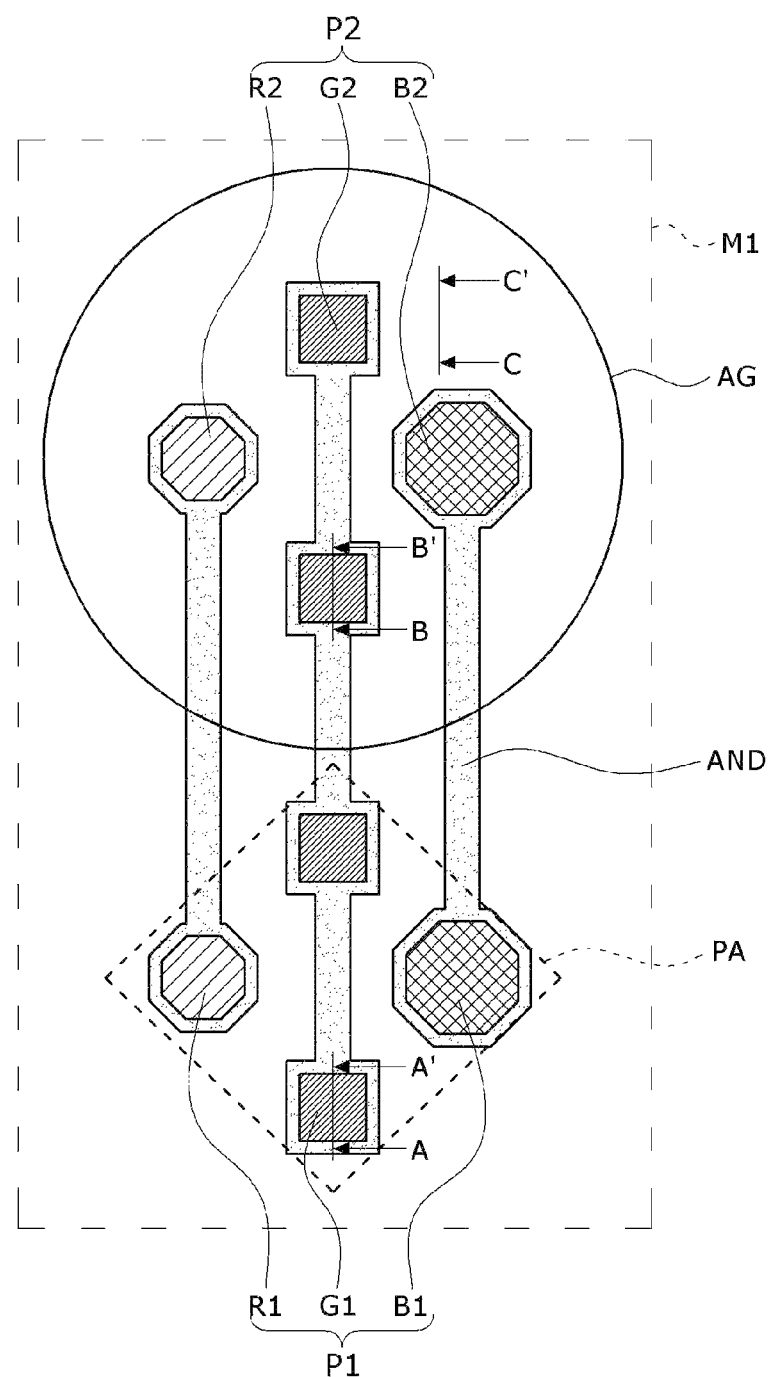
FIG. 23 is an enlarged view of portion M1 of FIG. 5 according to one embodiment.
Figure 24:
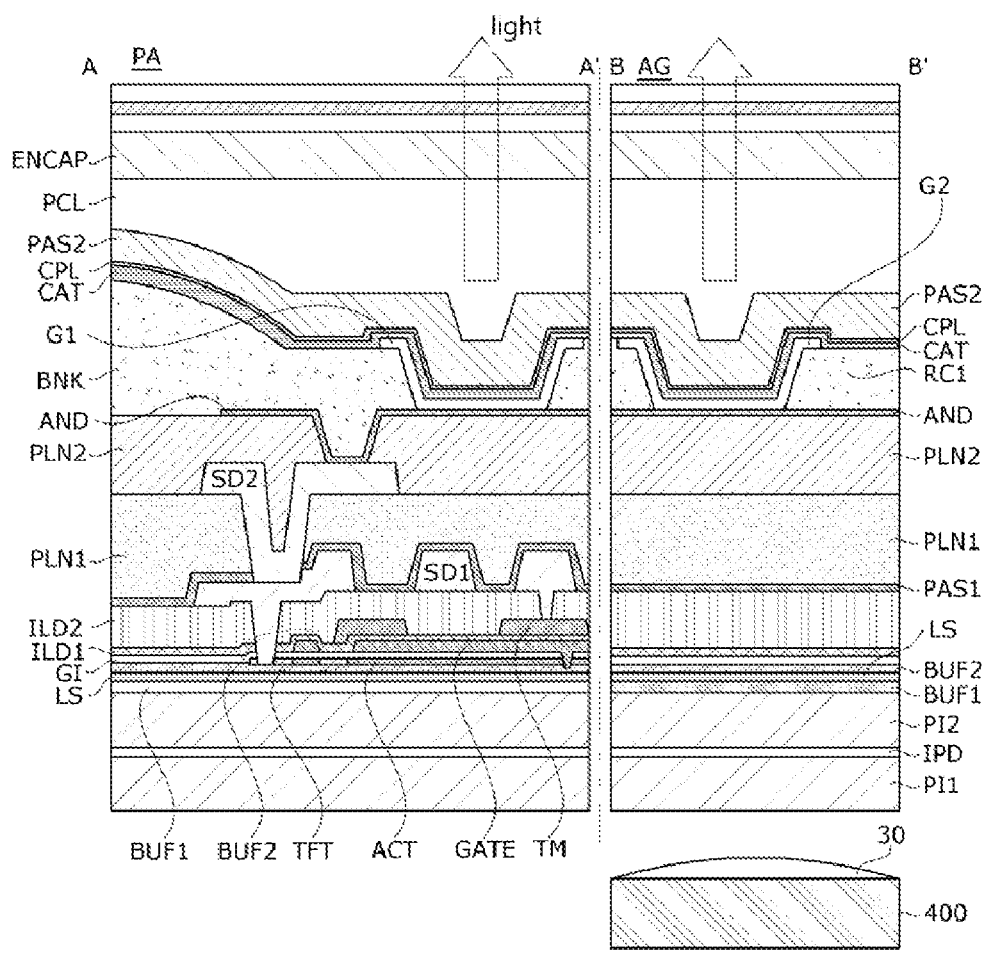
FIG. 24 is a view illustrating a cross-sectional structure of portions taken along lines A-A' and B-B' of FIG. 23 according to one embodiment.

FIG. 23 is an enlarged view of portion M1 of FIG. 5 according to one embodiment, and FIG. 24 is a view illustrating a cross-sectional structure of portions taken along lines A-A' and B-B' of FIG. 23 according to one embodiment.

Referring to FIGS. 23 and 24, it may be confirmed that the first electrode AND and the second electrode CAT, which are connected to each of the sub-pixels R1, G1, and B1 disposed in the pixel region PA, extend to the light-transmitting region AG and are connected to the dummy pixels R2, G2, and B2 disposed in the light-transmitting region.

The first light-blocking layer LS may be formed of a metal having a low absorption coefficient for a laser wavelength used in a laser ablation process as compared to a metal layer (e.g., a cathode) to be removed from the light-transmitting region AG.

The first light-blocking layer LS may also serve as a light shield layer that blocks a laser beam LB in the laser ablation process. In the region of the light-transmitting region AG, in which the pixels are disposed, the first light-blocking layer LS may be entirely disposed, so that the removal of electrodes or the pixels by the laser may be prevented or at least reduced.

Figure 25:
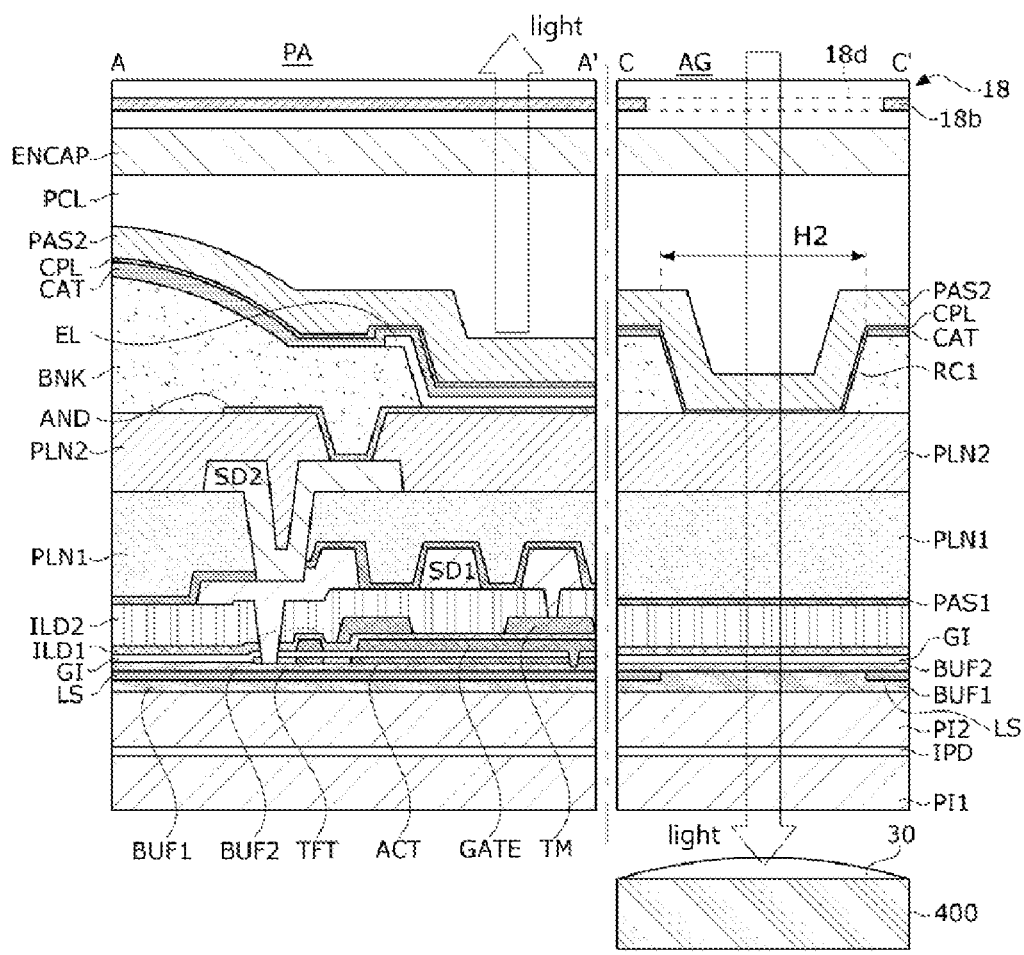
FIG. 25 is a view illustrating a cross-sectional structure of portions taken along lines A-A' and C-C' of FIG. 23 according to one embodiment.
Figure 26:
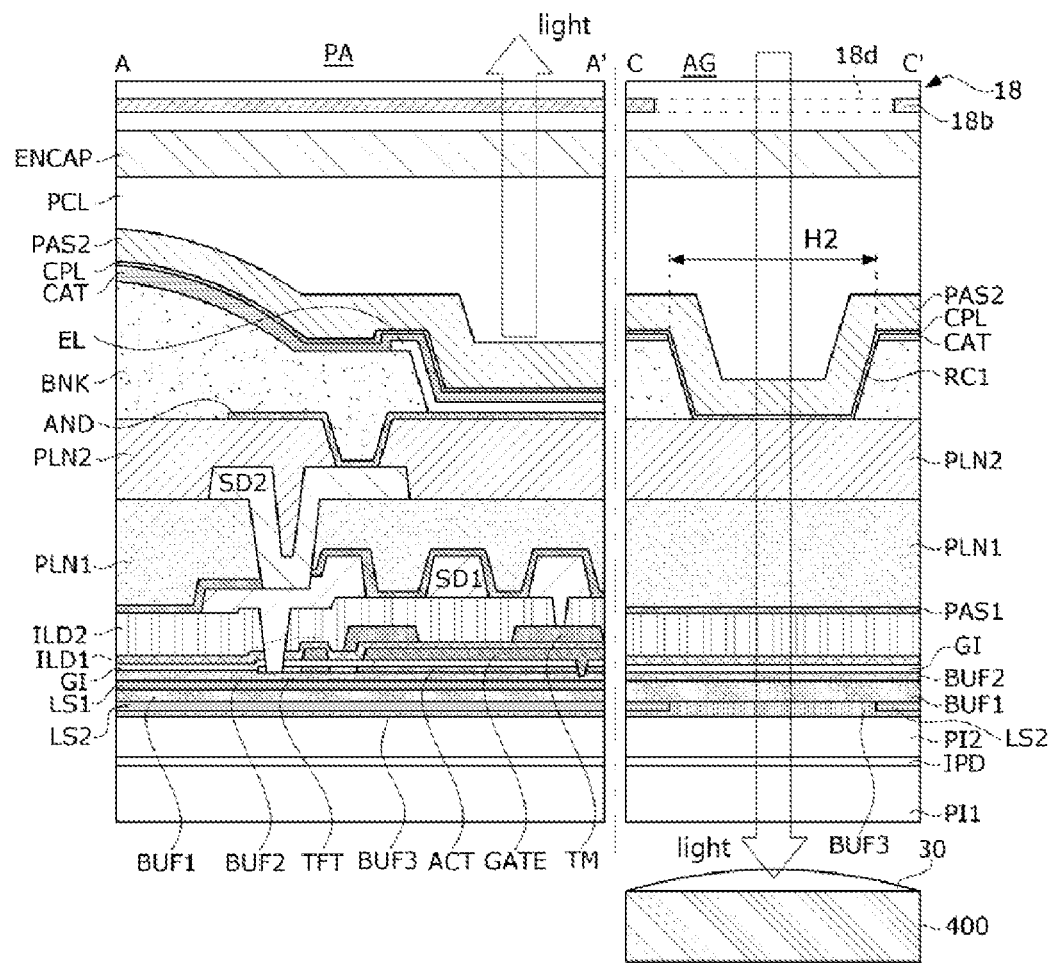
FIG. 26 is a modified example of FIG. 25 according to one embodiment.

FIG. 25 is a view illustrating a cross-sectional structure of portions taken along lines A-A' and C-C' of FIG. 23 according to one embodiment, and FIG. 26 is a modified example of FIG. 25 according to one embodiment.

Referring to FIG. 25, in the light-transmitting region AG, an opening H2 may be formed in the cathode CAT. The opening H2 may be formed by forming the cathode CAT on the pixel-defining film BNK and then etching the cathode CAT and the pixel-defining film BNK at one time. Accordingly, a first groove RC1 may be formed in the pixel-defining film BNK, and the opening H2 of the cathode CAT may be formed on the first groove RC1. However, the present disclosure is not necessarily limited thereto, and the cathode CAT may be disposed on the second planarization layer PLN2 without forming the pixel-defining film on the light-transmitting region AG.

In the light-transmitting region AG, a first light-transmitting pattern 18d may be formed in the polarizing plate 18. The first light-transmitting pattern 18d may be formed by discoloring a polarizer 18b using a laser, or the first light-transmitting pattern 18d may be formed by partially removing the polarizer 18b.

The polarizer 18b may be made of a dichroic material such as iodine and organic dyes. The organic dye may include azo-based pigments, stilbene-based pigments, pyrazolone-based pigments, triphenylmethane-based pigments, quinoline-based pigments, oxazine-based pigments, thiazine-based pigments, anthraquinone-based pigments, or the like, but the present disclosure is not necessarily limited thereto. When a laser of a specific wavelength is irradiated on the dichroic material, a light absorption rate may be lowered in a visible light region.

According to the embodiment, in the light-transmitting region AG, due to the irradiated laser, the first light-transmitting pattern 18d is formed in the polarizing plate 18, and the opening H2 is formed in the cathode so that light transmittance may be improved. Thus, a sufficient amount of light may be introduced into the camera module 400 so that camera performance may be improved. In addition, noise of imaged image data may be reduced.

Referring to FIG. 26, the pixel region may include a first light-blocking layer LS1 and a second light-blocking layer LS2, which is disposed between the first light-blocking layer LS1 and the substrates PI1 and PI2, that prevent or at least reduce light from being incident on the thin-film transistor.

The first light-blocking layer LS1 may block or at least reduce external light so that the light is not irradiated to an active layer of a TFT, thereby preventing or at least reducing a photo current of the TFT formed in the pixel region from generating. The first light-blocking layer LS1 may be disposed only in the pixel region PA and may not be disposed in the light-transmitting region AG.

The first buffer layer BUF1 may be disposed between the first light-blocking layer LS1 and the second light-blocking layer LS2 so that the first light-blocking layer LS1 and the second light-blocking layer LS2 may be electrically insulated from each other. Accordingly, the first light-blocking layer LS1 may maintain TFT characteristics as it is.

The second light-blocking layer LS2 may extend to the light-transmitting region AG and may be patterned. The second light-blocking layer LS2 may be formed of a metal having a low absorption coefficient for a laser wavelength used in a laser ablation process as compared to a metal layer (e.g., a cathode) to be removed from the light-transmitting region AG.

Thus, when the second light-blocking layer LS2 is previously patterned, and then a laser is irradiated from a rear surface, the second electrode CAT may be removed from the remaining light-transmitting region AG except for the region in which the second pixel is formed.

According to the embodiment, the first light-blocking layer LS1 may serve to block light from entering the TFT, and the second light-blocking layer LS2 may serve to pattern the second electrode CAT in the light-transmitting region AG.

Figure 27:
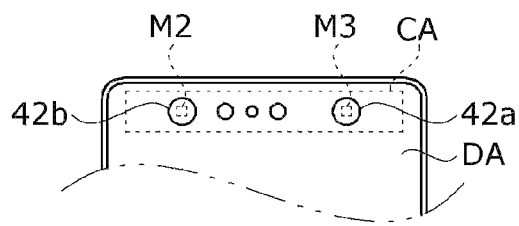
FIG. 27 a view illustrating various electronic devices disposed in a second display region according to one embodiment.
Figure 28:
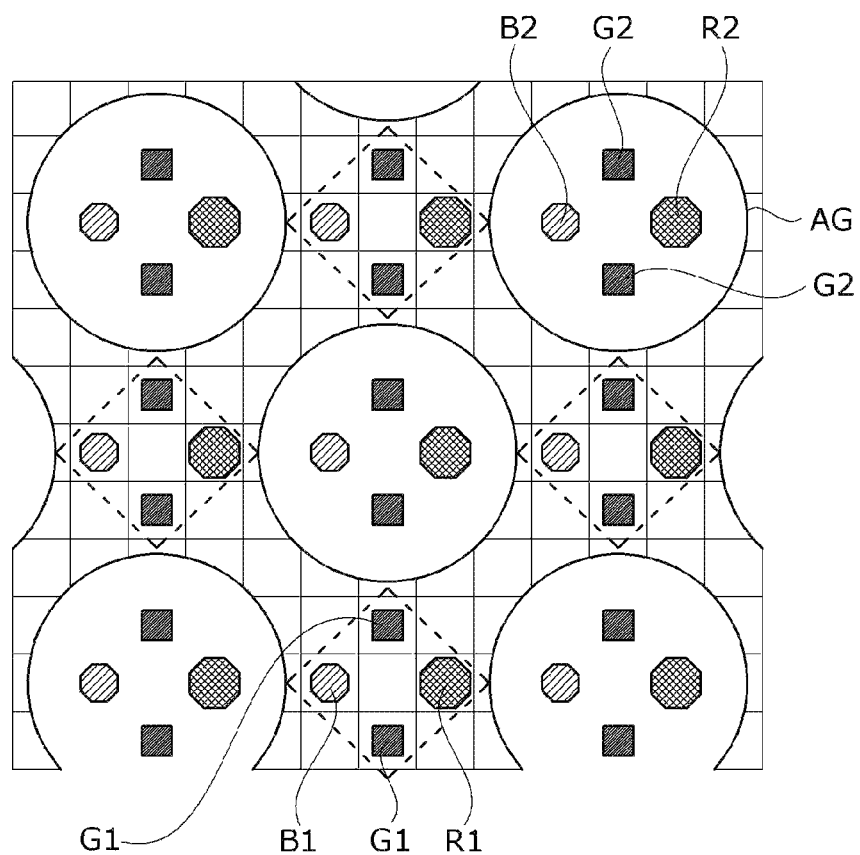
FIG. 28 is an enlarged view of portion M2 of FIG. 27 according to one embodiment.
Figure 29:
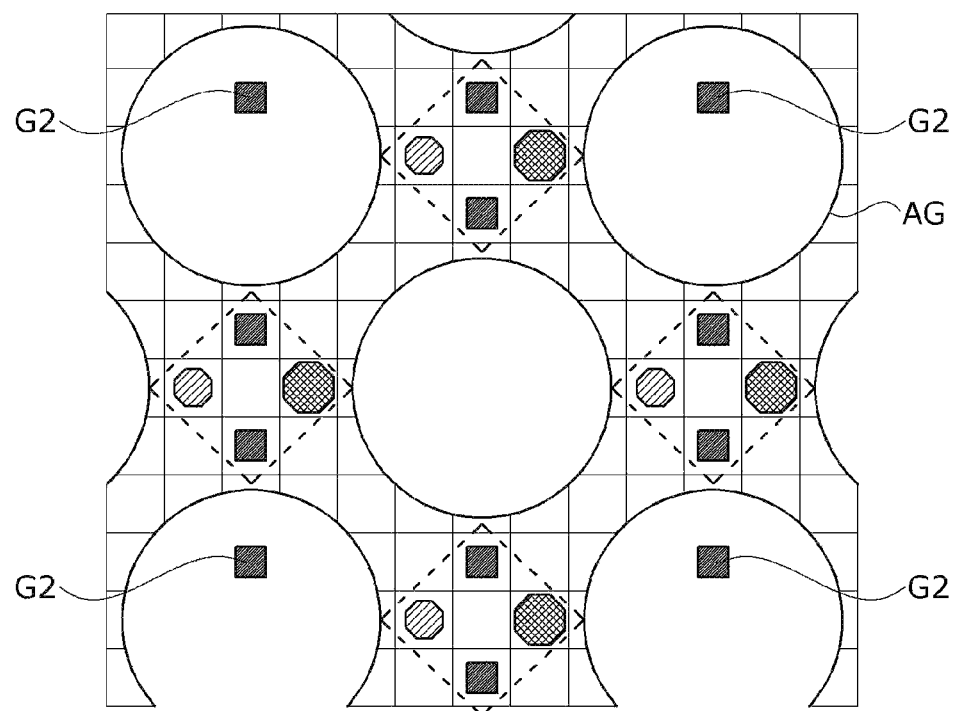
FIG. 29 is an enlarged view of portion M3 of FIG. 27 according to one embodiment.

FIG. 27 a view illustrating various electronic devices disposed in a second display region according to one embodiment, FIG. 28 is an enlarged view of portion M2 of FIG. 27 according to one embodiment, and FIG. 29 is an enlarged view of portion M3 of FIG. 27 according to one embodiment.

Referring to FIG. 27, a display panel may include a plurality of electronic devices disposed in a second display region CA. For example, the plurality of electronic devices may include an ambient light sensor for determining surrounding brightness, a proximity sensor, a first camera module 42a having an image sensor embedded therein, and a second camera module 42b configured to receive infrared light. The first camera module 42a may be provided with an infrared filter, and thus may cut off an infrared wavelength band and receive visible light, while the second camera module 42b may receive light of the infrared wavelength band.

At this point, the second camera module 42b may perform relatively accurate measurement even with a smaller amount of light as compared with the first camera module 42a. Thus, a pattern of a second pixel P2 disposed on the first camera module 42a and a pattern of a second pixel P2 disposed on the second camera module 42b may be disposed differently.

As an example, in a region in which the second camera module 42b is disposed among the second display region CA, as shown in FIG. 28, all of a red pixel R2, a green pixel G2, and a blue pixel B1 may be disposed in a light-transmitting region AG. In contrast, in a region in which the first camera module 42a is disposed, as shown in FIG. 29, only the green pixel G2 may be disposed in the light-transmitting region AG. In addition, in the region in which the first camera module 42a is disposed, the pixels are not disposed in a partial region of the light-transmitting region AG, so that a light-transmitting area may be secured as much as possible.

According to embodiments, it is possible to improve display performance by increasing a light-emitting area in an imaged region.

It is also possible to improve camera performance by securing a sufficient amount of light transmission in an imaged region.

It is also possible to improve a lifespan of a pixel.

It is also possible to reduce manufacturing costs using the same fine metal mask (FMM) when pixels are formed in a display region and an imaged region.

The effects according to the embodiments of the present disclosure are not limited by the contents exemplified above, and more various effects are included in the present specification.

While the embodiments of the present disclosure have been described in detail above with reference to the accompanying drawings, the present disclosure is not necessarily limited to these embodiments, and various changes and modifications may be made without departing from the technical spirit of the present disclosure. Accordingly, embodiments disclosed herein are to be considered descriptive and not restrictive of the technical spirit of the present disclosure, and the scope of the technical spirit of the present disclosure is not limited by these embodiments. Therefore, the above-described embodiments should be understood to be exemplary and not limiting in any aspect. The scope of the present disclosure should be construed by the appended claims, and all technical spirits within the scopes of their equivalents should be construed as being included in the scope of the present disclosure.

What is claimed is:

1. A display panel comprising:
   a first display region in which a plurality of pixels are disposed; and
   a second display region including a plurality of pixel regions, in which a plurality of pixels are disposed, and a plurality of light-transmitting regions disposed between the plurality of pixel regions,
   wherein the second display region includes:
      a plurality of first pixels respectively disposed in the plurality of pixel regions,
      a plurality of second pixels respectively disposed in the plurality of light-transmitting regions,
      a plurality of first electrodes respectively extending from the plurality of pixel regions to the plurality of light-transmitting regions to electrically connect each of the plurality of first pixels to each of the plurality of second pixels respectively, and
      a second electrode covering the plurality of first electrodes,
      wherein the plurality of first electrodes and the second electrode have a shape corresponding to each other and overlap in a vertical direction in the plurality of light-transmitting regions.

2. The display panel of claim 1, wherein pixel data applied to each of the plurality of first pixels is equally applied to a corresponding second pixel from the plurality of second pixels by the plurality of first electrodes, such that an image output from each of the plurality of first pixels is a same as an image output from the corresponding second pixel.

3. The display panel of claim 1, wherein a first pixel from the plurality of first pixels is a driving pixel including a pixel circuit and a light-emitting element, while a second pixel from the plurality of second pixels is a dummy pixel of the first pixel, which includes a light-emitting element but not a pixel circuit.

4. The display panel of claim 1, wherein the second display region includes a second electrode covering the plurality of pixel regions and including a plurality of openings corresponding to the plurality of light-transmitting regions, and the second electrode extends to an inside of each of the plurality of openings to electrically connect each of the plurality of first pixels to each of the plurality of second pixels respectively.

5. The display panel of claim 1, wherein a number of pixels, which are disposed in the first display region, per unit area is a same as a number of pixels, which are disposed in the second display region, per unit area.

6. The display panel of claim 1, wherein a number of pixels, which are disposed in the first display region, per unit area is different from a number of pixels, which are disposed in the second display region, per unit area.

7. The display panel of claim 1, wherein each of the plurality of first pixels comprises a number of sub-pixels and each of the plurality of second pixels comprises a number of sub-pixels and, wherein the number of sub-pixels of each of the plurality of second pixels is a same as or less than the number of sub-pixels of each of the plurality of first pixels.

8. The display panel of claim 1, wherein each of the plurality of second pixels disposed in the plurality of light-transmitting regions includes a first sub-pixel and a second sub-pixel,
   the first sub-pixel of the second pixel is electrically connected to a first sub-pixel of a first pixel region among the plurality of pixel regions surrounding the corresponding light-transmitting region, and the second sub-pixel of the second pixel is electrically connected to a second sub-pixel of the first pixel region.

9. The display panel of claim 1, wherein each of the plurality of second pixels disposed in the plurality of light-transmitting regions includes a first sub-pixel and a second sub-pixel,
   the first sub-pixel of the second pixel is electrically connected to a first sub-pixel of a first pixel region among the plurality of pixel regions surrounding the corresponding light-transmitting region, and the second sub-pixel of the second pixel is electrically connected to a second sub-pixel of a second pixel region among the plurality of pixel regions surrounding the corresponding light-transmitting region.

10. The display panel of claim 1, wherein each of the plurality of second pixels disposed in the plurality of light-transmitting regions includes a first unit sub-pixel and a second unit sub-pixel that output a same color,
    the first unit sub-pixel is electrically connected to a second sub-pixel of a first pixel region among the plurality of pixel regions surrounding the corresponding light-transmitting region, and the second unit sub-pixel is electrically connected to a second sub-pixel of a second pixel region among the plurality of pixel regions surrounding the corresponding light-transmitting region, and
    wherein the first unit sub-pixel, the second unit sub-pixel, and the second sub-pixel output a same color.

11. The display panel of claim 10, wherein the plurality of first electrodes include a first unit sub-electrode corresponding to the first unit sub-pixel and a second unit sub-electrode corresponding to the second unit sub-pixel in each of the plurality of light-transmitting regions, and the first unit sub-electrode and second unit sub-electrode are spaced apart from each other.

12. The display panel of claim 10, wherein each of the plurality of first pixels includes a first sub-pixel, and a second sub-pixel, and a third sub-pixel,
    each of the plurality of second pixels is configured in a form in which at least one of the first sub-pixel, the second sub-pixel, and the third sub-pixel is omitted, and
    different sub-pixels are disposed in neighboring second pixels.

13. A display panel comprising:
    a first display region in which a plurality of pixels are disposed; and
    a second display region including a pixel region, in which a plurality of pixels are disposed, and a light-transmitting region adjacent to the pixel region,
    wherein the second display region includes:
       a plurality of first electrodes extending from the pixel region to the light-transmitting region, and
       a second electrode covering the plurality of first electrodes,
       wherein a shape of the second electrode disposed in the light-transmitting region is different from a shape of the second electrode disposed in the pixel region.

14. The display panel of claim 13, wherein the plurality of first electrodes electrically connect a pixel disposed in the light-transmitting region and a pixel disposed in the pixel area.

15. The display panel of claim 14, wherein the second electrode includes an opening corresponding to the light-transmitting region and the plurality of first electrodes extend to an inside of the opening.

* * * * *